United States Patent
Chen et al.

(10) Patent No.: US 12,125,897 B2
(45) Date of Patent: Oct. 22, 2024

(54) AIR SPACERS IN TRANSISTORS AND METHODS FORMING SAME

(71) Applicant: Taiwan Semiconductor Manufacturing Co., Ltd., Hsinchu (TW)

(72) Inventors: Yi-Lun Chen, Taichung (TW); Chao-Hsien Huang, Kaohsiung (TW); Li-Te Lin, Hsinchu (TW); Chun-Hsiung Lin, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/343,322

(22) Filed: Jun. 28, 2023

(65) Prior Publication Data

US 2023/0343649 A1    Oct. 26, 2023

Related U.S. Application Data

(60) Continuation of application No. 17/201,342, filed on Mar. 15, 2021, now Pat. No. 11,728,221, which is a continuation of application No. 16/566,226, filed on Sep. 10, 2019, now Pat. No. 10,964,795, which is a division of application No. 15/966,603, filed on Apr. 30, 2018, now Pat. No. 10,861,953.

(51) Int. Cl.
*H01L 29/66* (2006.01)
*H01L 21/8234* (2006.01)
*H01L 21/8238* (2006.01)
*H01L 29/51* (2006.01)
*H01L 29/78* (2006.01)

(52) U.S. Cl.
CPC .. *H01L 29/6653* (2013.01); *H01L 21/823468* (2013.01); *H01L 21/823864* (2013.01); *H01L 29/515* (2013.01); *H01L 29/66545* (2013.01); *H01L 29/66553* (2013.01); *H01L 29/66795* (2013.01); *H01L 29/785* (2013.01)

(58) Field of Classification Search
CPC .............. H01L 29/6653; H01L 29/515; H01L 29/66795; H01L 29/785; H01L 29/66636
See application file for complete search history.

(56) References Cited

U.S. PATENT DOCUMENTS

| | | |
|---|---|---|
| 8,637,384 B2 | 1/2014 | Ando et al. |
| 9,368,572 B1 | 6/2016 | Cheng et al. |
| 9,536,982 B1 | 1/2017 | Cheng et al. |

(Continued)

FOREIGN PATENT DOCUMENTS

| | | |
|---|---|---|
| CN | 106252410 A | 12/2016 |
| CN | 106549059 A | 3/2017 |

*Primary Examiner* — Peter M Albrecht
(74) *Attorney, Agent, or Firm* — Slater Matsil, LLP

(57) ABSTRACT

A method includes forming a gate stack over a semiconductor region, and forming a first gate spacer on a sidewall of the gate stack. The first gate spacer includes an inner sidewall spacer, and a dummy spacer portion on an outer side of the inner sidewall spacer. The method further includes removing the dummy spacer portion to form a trench, and forming a dielectric layer to seal a portion of the trench as an air gap. The air gap and the inner sidewall spacer in combination form a second gate spacer. A source/drain region is formed to have a portion on an outer side of the second gate spacer.

20 Claims, 43 Drawing Sheets

(56) References Cited

U.S. PATENT DOCUMENTS

| | | |
|---|---|---|
| 10,096,693 B2 | 10/2018 | Ching et al. |
| 10,868,150 B2 | 12/2020 | Chiang et al. |
| 2008/0254579 A1 | 10/2008 | Chi et al. |
| 2011/0303967 A1 | 12/2011 | Harari et al. |
| 2013/0164926 A1 | 6/2013 | Lee |
| 2013/0248950 A1 | 9/2013 | Kang et al. |
| 2013/0299920 A1 | 11/2013 | Yin et al. |
| 2014/0203348 A1* | 7/2014 | Suk .................. H01L 29/785 257/327 |
| 2014/0246724 A1 | 9/2014 | Jang et al. |
| 2015/0091089 A1 | 4/2015 | Niebojewski et al. |
| 2015/0255571 A1* | 9/2015 | Xu ................... H01L 29/6653 257/288 |
| 2016/0049487 A1 | 2/2016 | Xu et al. |
| 2016/0163816 A1 | 6/2016 | Yu et al. |
| 2016/0225667 A1 | 8/2016 | Zang |
| 2016/0293715 A1 | 10/2016 | Zang |
| 2016/0365426 A1 | 12/2016 | Ching et al. |
| 2017/0077256 A1 | 3/2017 | Adusumilli et al. |
| 2017/0084714 A1 | 3/2017 | Chign et al. |
| 2017/0098711 A1 | 4/2017 | Hsiao et al. |
| 2018/0233398 A1 | 8/2018 | Cleemput et al. |
| 2018/0277430 A1 | 9/2018 | Xie et al. |

\* cited by examiner

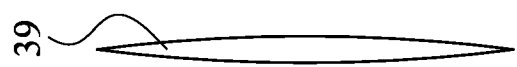
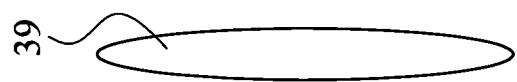
Fig. 37

AIR SPACERS IN TRANSISTORS AND METHODS FORMING SAME

PRIORITY CLAIM AND CROSS-REFERENCE

This application is a continuation of U.S. patent application Ser. No. 17/201,342, entitled "Air Spacers in Transistors and Methods Forming Same," filed on Mar. 15, 2021, which is a continuation of U.S. patent application Ser. No. 16/566,226, entitled "Air Spacers in Transistors and Methods Forming Same," filed on Sep. 10, 2019, now U.S. Pat. No. 10,964,795, issued Mar. 30, 2021, which is a divisional of U.S. patent application Ser. No. 15/966,603, entitled "Air Spacers in Transistors and Methods Forming Same," filed on Apr. 30, 2018, now U.S. Pat. No. 10,861,953, issued Dec. 8, 2020, which applications are incorporated herein by reference.

BACKGROUND

Technological advances in Integrated Circuit (IC) materials and design have produced generations of ICs, with each generation having smaller and more complex circuits than the previous generations. In the course of IC evolution, functional density (for example, the number of interconnected devices per chip area) has generally increased while geometry sizes have decreased. This scaling down process provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically involves forming semiconductor fins, implanting the semiconductor fins to form well regions, forming dummy gate electrodes on the semiconductor fins, etching some portions of the semiconductor fins, and performing an epitaxy to regrow source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 37 illustrate various shapes of air gaps in gate spacers in accordance with some embodiments.

DETAILED DESCRIPTION

Figure 1:
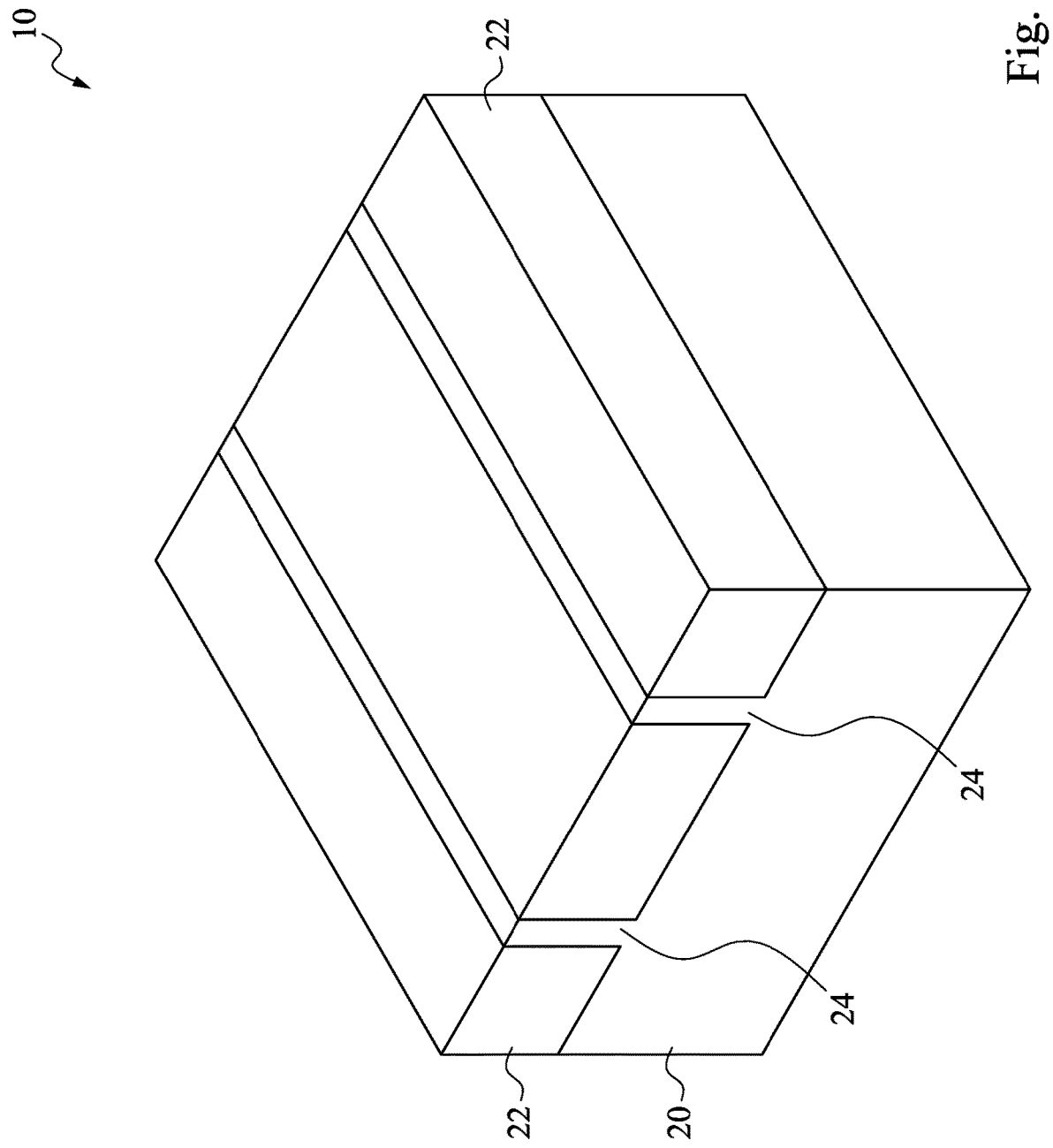
FIGS. 1 through 4, 5A, 5B, and FIGS. 6 through 9 are perspective views of intermediate stages in the formation of a Fin Field-Effect Transistor (FinFET) including air gaps in gate spacers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concept of the present disclosure. Planar transistors may also adopt the concept of the present disclosure.

Figure 38:
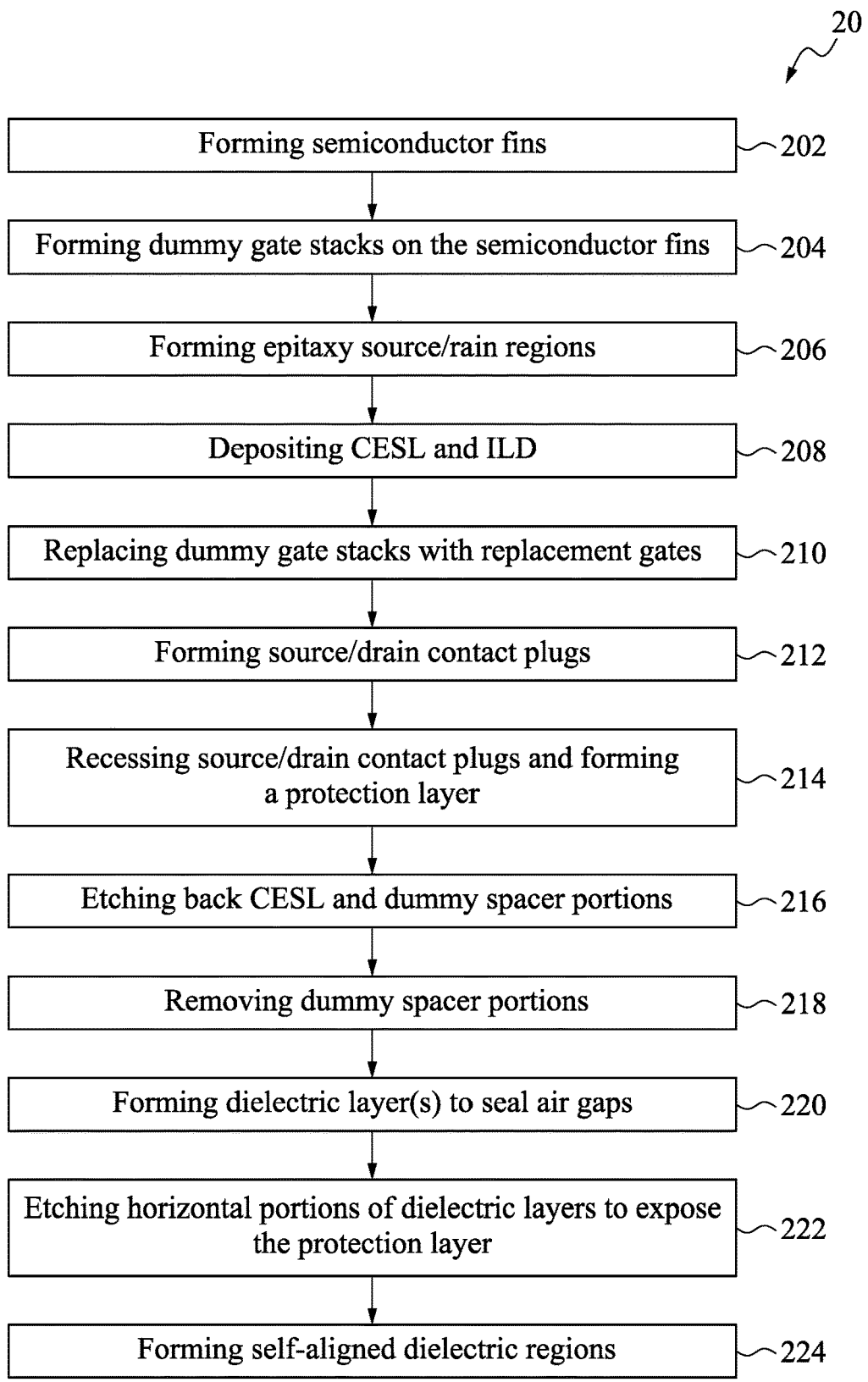
FIG. 38 illustrates a process flow for forming a transistor and contact plugs in accordance with some embodiments.

FIGS. 1 through 9 illustrate the perspective views of intermediate stages in the formation of air gaps in gate spacers in accordance with some embodiments of the present disclosure. The steps shown in FIGS. 1 through 9 are also reflected schematically in the process flow 200 as shown in FIG. 38.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some exemplary embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
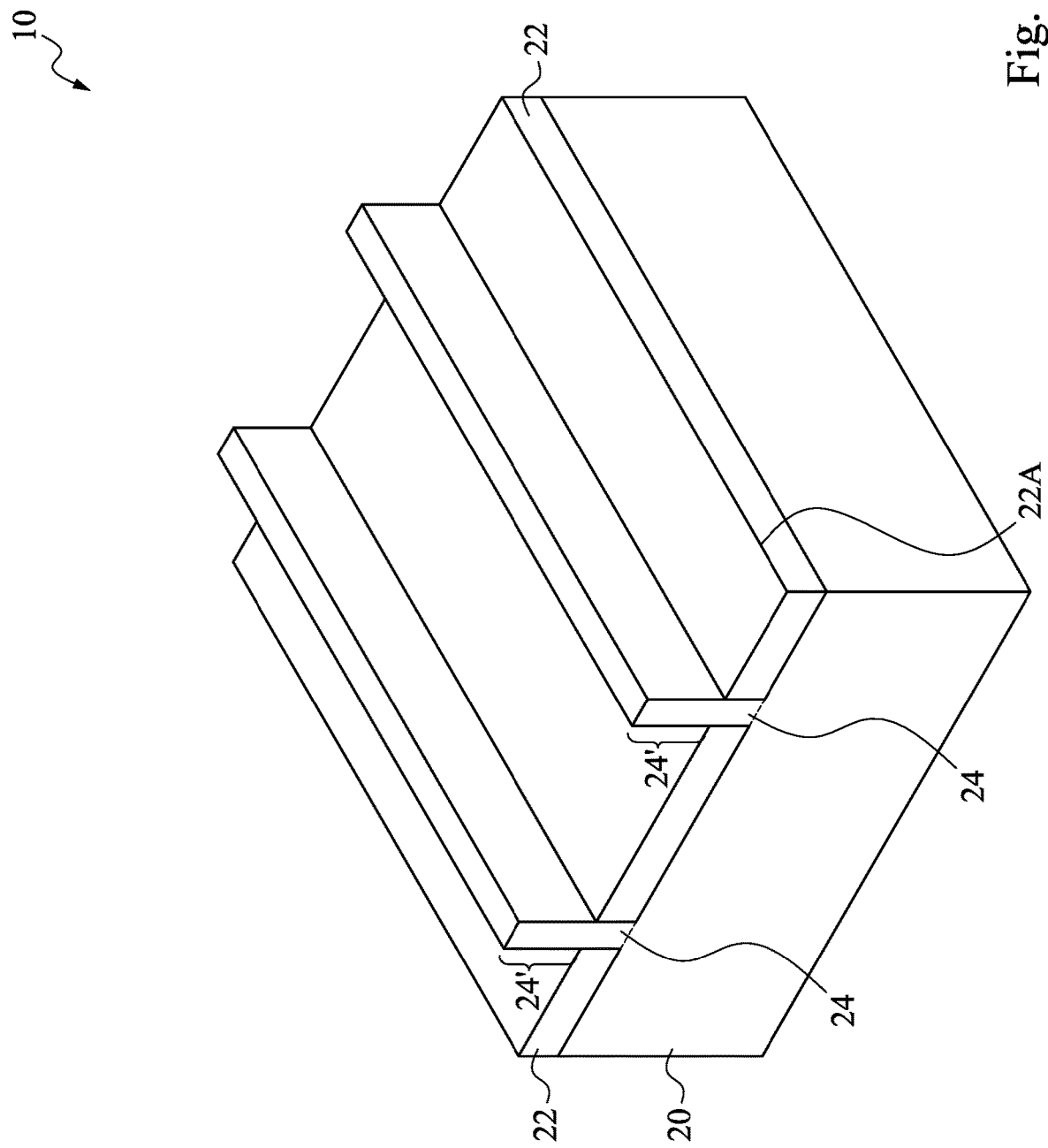

Referring to FIG. 2, STI regions 22 are recessed, so that the top portions of semiconductor strips 24 protrude higher than the top surfaces 22A of the remaining portions of STI regions 22 to form protruding fins 24'. The respective step is illustrated as step 202 in the process flow 200 as shown in FIG. 38. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etch process. The etching chemical may include HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
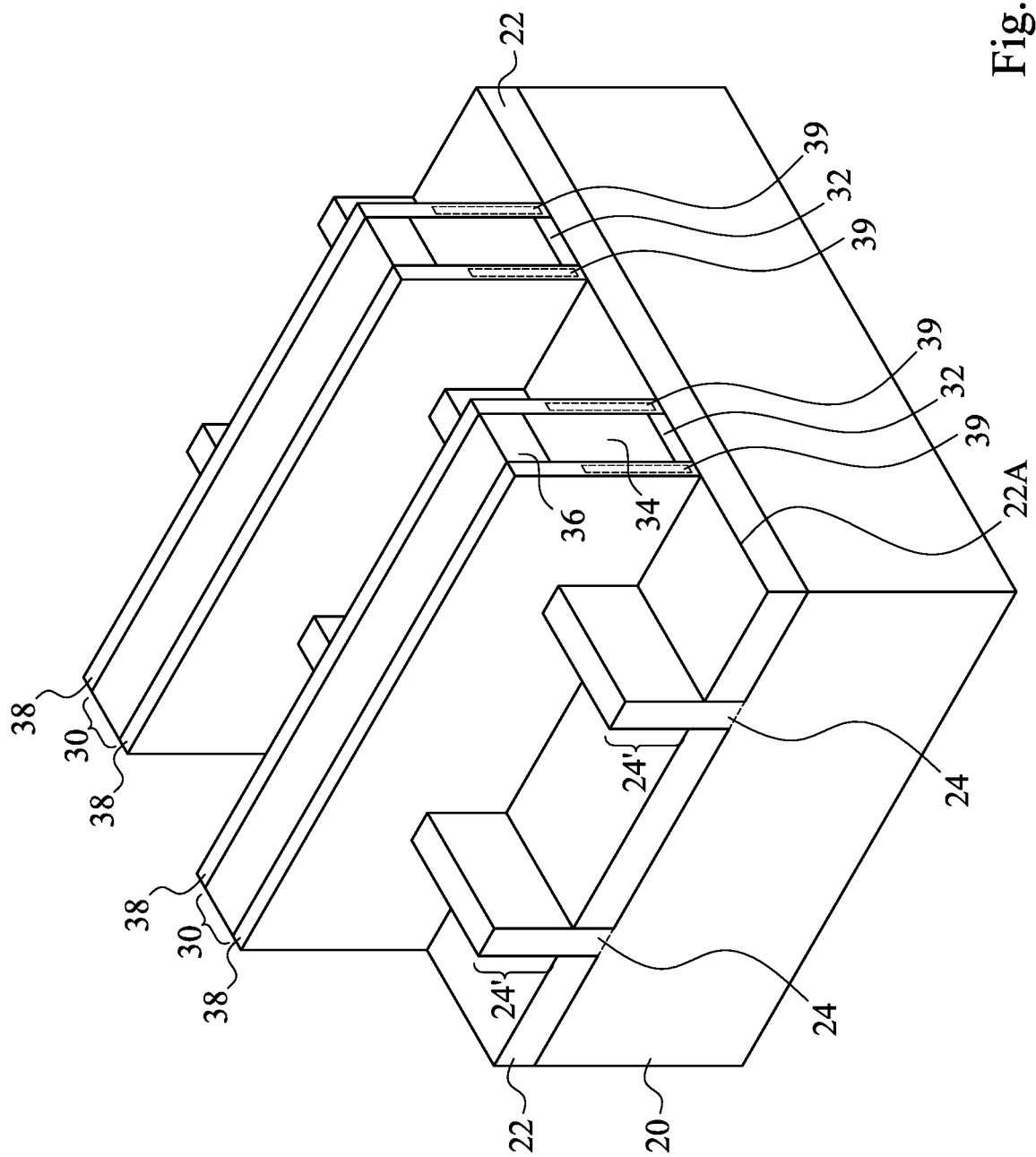

Referring to FIG. 3, dummy gate stacks 30 are formed on the top surfaces and the sidewalls of (protruding) fins 24'. The respective step is illustrated as step 204 in the process flow 200 as shown in FIG. 38. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over the respective dummy gate electrodes 34. Hard mask layers 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as silicon nitride, silicon carbo-nitride (SiCN), silicon oxy-carbo-nitride (SiOCN), or the like, and may have a single-layer structure or a multi-layer structure including a plurality of dielectric layers.

In accordance with some embodiments of the present disclosure, air gaps 39 are formed in gate spacers 38. Air gaps 39 may be filled with air, or may be vacuumed or substantially vacuumed to have a pressure lower than one atmosphere. The processes for forming the corresponding air gaps 39 are shown in detail in FIGS. 10 through 18, 19A, and 19B, and discussed accordingly. In accordance with alternative embodiments of the present disclosure, air gaps 39 are not formed in gate spacers 38 at this time. Rather, air gaps 39 are formed in subsequent processes. Accordingly, air gaps 39 are illustrated as dashed to indicate they may or may not exist at this stage.

Figure 4:
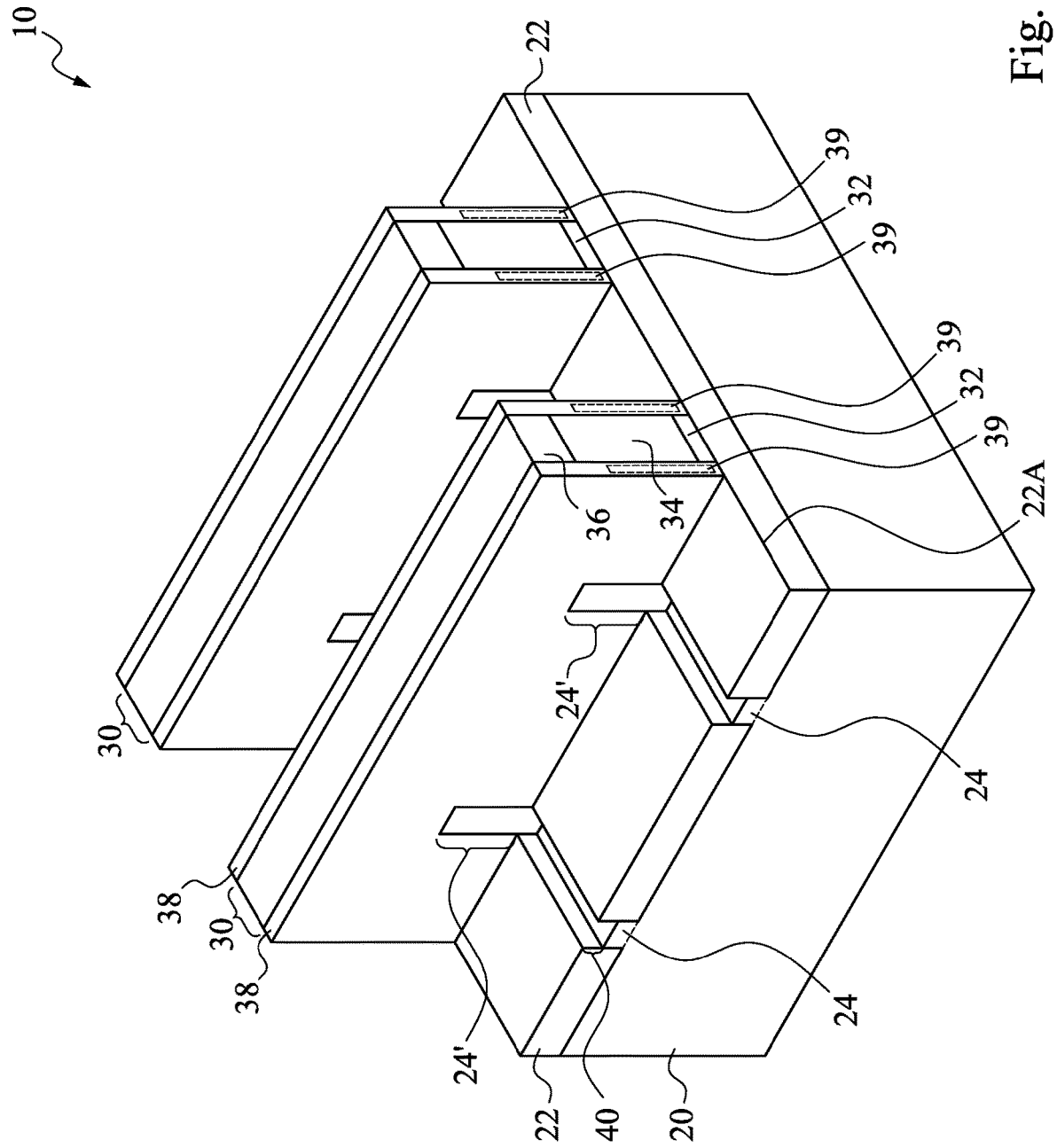

In accordance with some embodiments of the present disclosure, an etching step (referred to as source/drain recessing hereinafter) is performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Figure 5A:
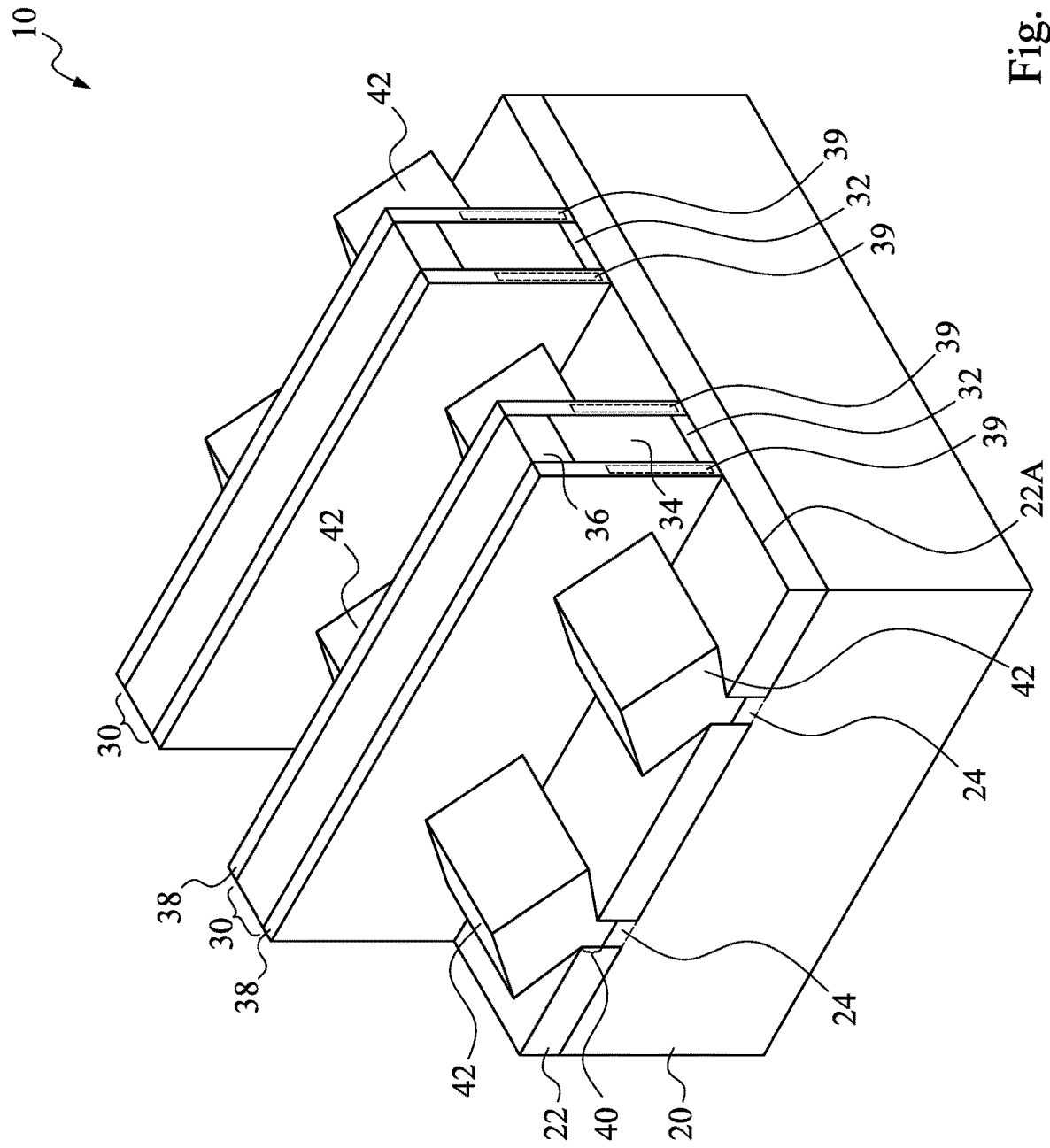

Next, epitaxy regions (source/drain regions) 42 are formed by selectively growing a semiconductor material in recesses 40, resulting in the structure in FIG. 5A. The respective step is illustrated as step 206 in the process flow 200 as shown in FIG. 38. In accordance with some exemplary embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy to form source/drain regions. Epitaxy source/drain regions 42 include lower portions that are formed in STI regions 22, and upper portions that are formed over the top surfaces of STI regions 22.

Figure 5B:
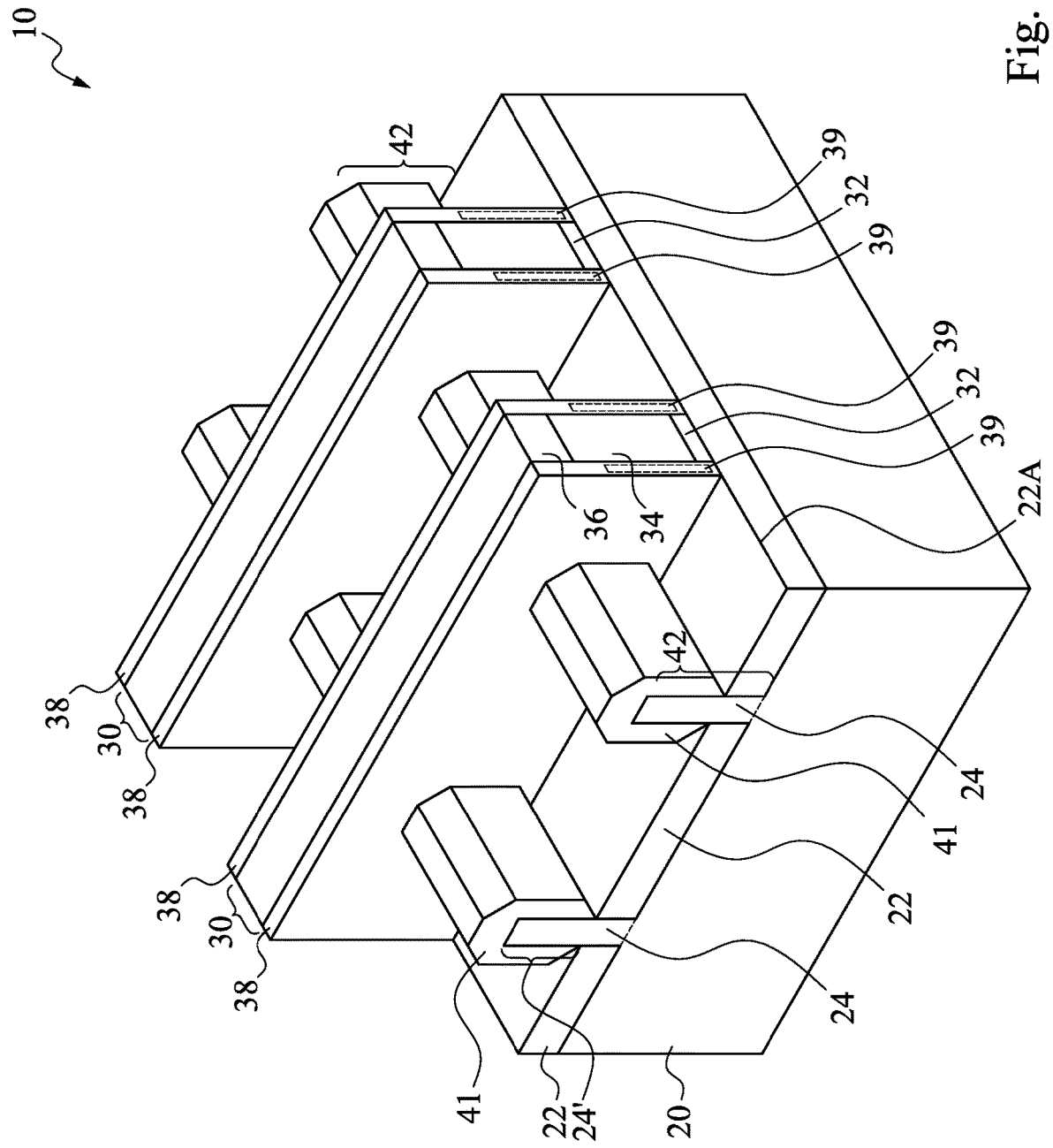

FIG. 5B illustrates the formation of source/drain regions 42 in accordance with alternative embodiments of the present disclosure. In accordance with these embodiments, the protruding fins 24' as shown in FIG. 3 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drains 42 include protruding fins 24' and the epitaxy regions 41. An implantation may be performed to implant an n-type impurity or a p-type impurity.

Figure 6:
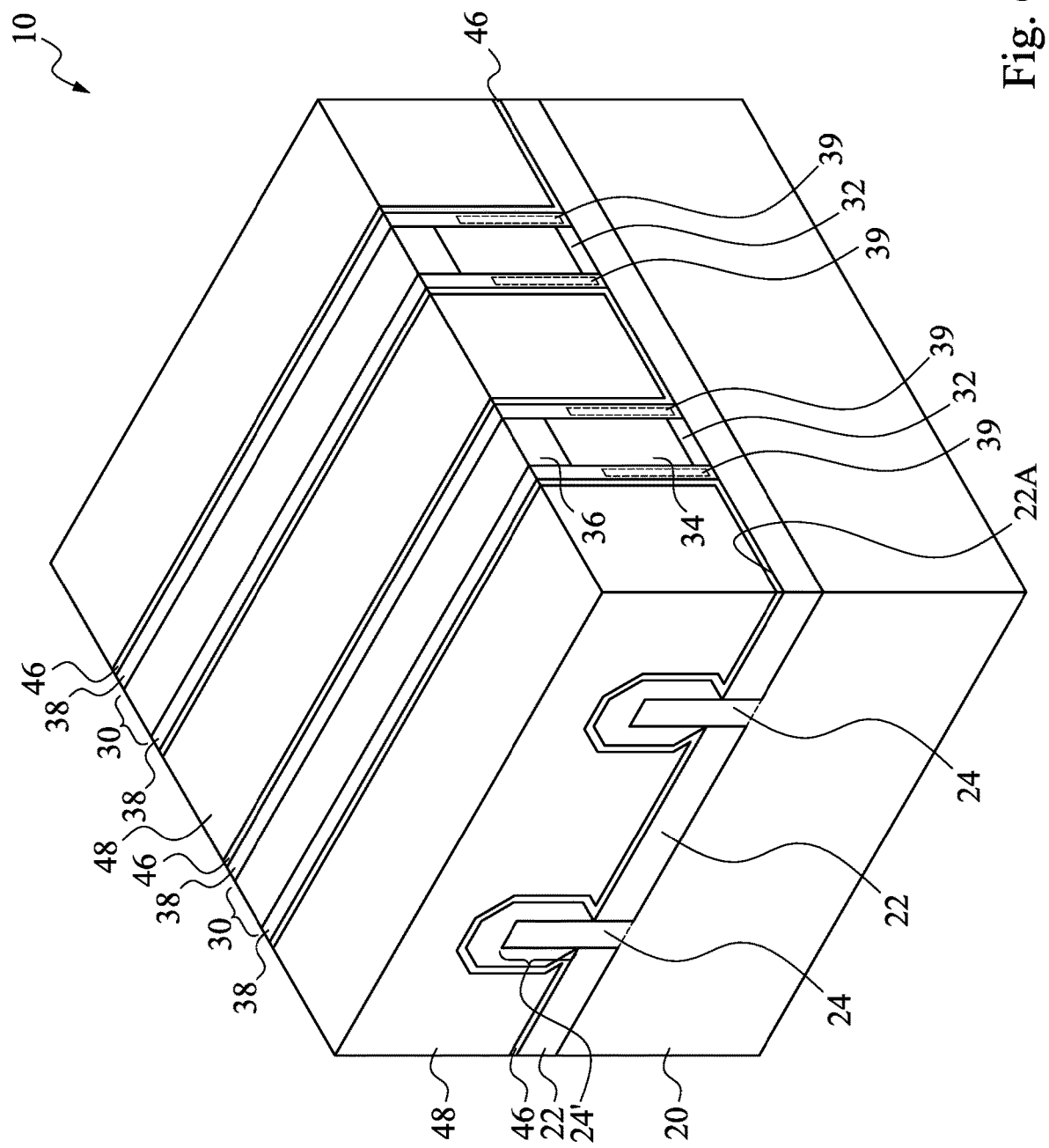

FIG. 6 illustrates a perspective view of the structure after the formation of Contact Etch Stop Layer (CESL) 46 and Inter-Layer Dielectric (ILD) 48. The respective step is illustrated as step 208 in the process flow 200 as shown in FIG. 38. CESL 46 may be formed of silicon nitride, silicon carbo-nitride, or the like. In accordance with some embodiments of the present disclosure, CESL 46 is formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be a silicon-oxide based material such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as Chemical Mechanical Polish (CMP) process or mechanical grinding process may be performed to level the top surfaces of ILD 48, dummy gate stacks 30, and gate spacers 38 with each other.

Figure 7:
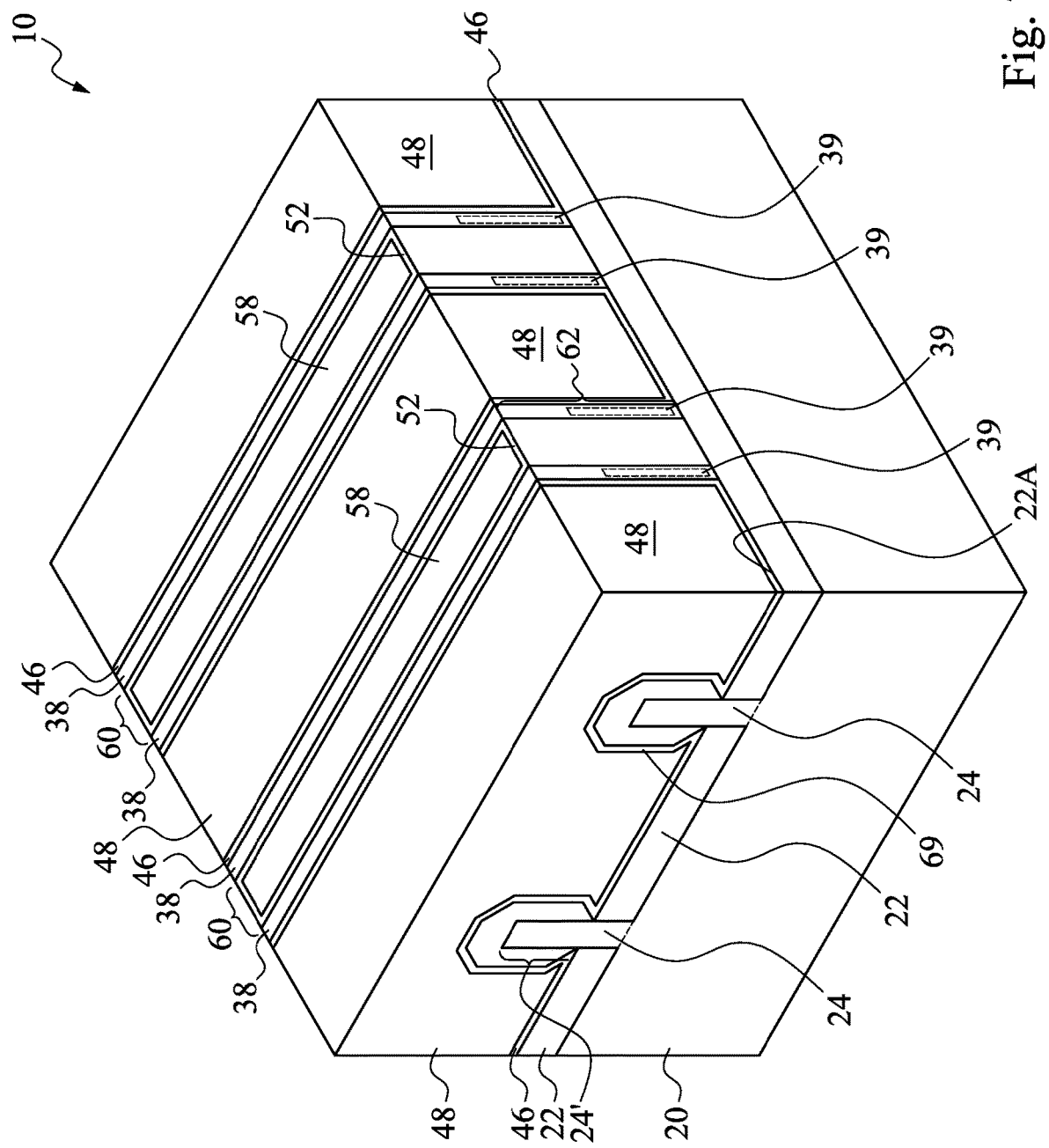

Next, dummy gate stacks 30, which include hard mask layers 36, dummy gate electrodes 34 and dummy gate dielectrics 32, are replaced with replacement gate stacks, which include metal gates and replacement gate dielectrics as shown in FIG. 7. The respective step is illustrated as step 210 in the process flow 200 as shown in FIG. 38. When forming replacing gate stacks, the hard mask layers 36, dummy gate electrodes 34, and dummy gate dielectrics 32 as shown in FIG. 6 are first removed in a plurality of etching steps, resulting in the trenches/openings to be formed between gate spacers 38. The top surfaces and the sidewalls of protruding semiconductor fins 24' are exposed to the trenches. Next, as shown in FIG. 7, (replacement) gate dielectric layer 52 is formed. Gate electrode 58 is formed over gate dielectric layer 52. In accordance with some embodiments of the present disclosure, gate dielectric 52 includes Interfacial Layer (IL) 54 (FIG. 20) as its lower part. IL 54 is formed on the exposed surfaces of protruding fins 24'. IL 54 may include an oxide layer such as a silicon oxide layer, which is formed through a thermal oxidation of protruding fins 24', a chemical oxidation process, or a deposition process. Gate dielectric 52 may also include high-k dielectric layer 56 (FIG. 20) formed over IL 54. High-k dielectric layer 56 includes a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. High-k dielectric layer 56 is formed as a conformal layer, and extends on the sidewalls of protruding fins 24' and the sidewalls of gate spacers 38. In accordance with some embodiments of the present disclosure, high-k dielectric layer 56 is formed using ALD or CVD.

Gate electrode 58 may include a plurality of stacked conductive sub-layers. The sub-layers in gate electrode 58 are not shown separately, while in the actual structure, the sub-layers are distinguishable from each other. The formation of gate electrode 58 may be performed using a conformal deposition method such as ALD or CVD, so that the thickness of the vertical portions and the thickness of the horizontal portions of the lower sub-layers of gate electrode 58 are substantially equal to each other.

Gate electrode 58 may include a diffusion barrier layer and one (or more) work-function layer (not shown separately) over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), a barrier layer, which may be another TiN layer, is formed.

Gate electrode 58 may also include a filling metal filling all of the remaining trenches unfilled by the underlying sub-layers. The filling metal may be formed of tungsten or cobalt, for example. After the formation of the filling material, a planarization process such as a CMP process or a mechanical grinding process is performed, so that the portions of layers 52 and 58 over ILD 48 are removed. The remaining portion of gate dielectric 52 and gate electrode 58 are referred to as replacement gate 62 hereinafter. As shown in FIG. 7, the top surfaces of gate electrode 58, gate spacers 38, CESL 46, and ILD 48 may be substantially coplanar at this time.

Figure 8:
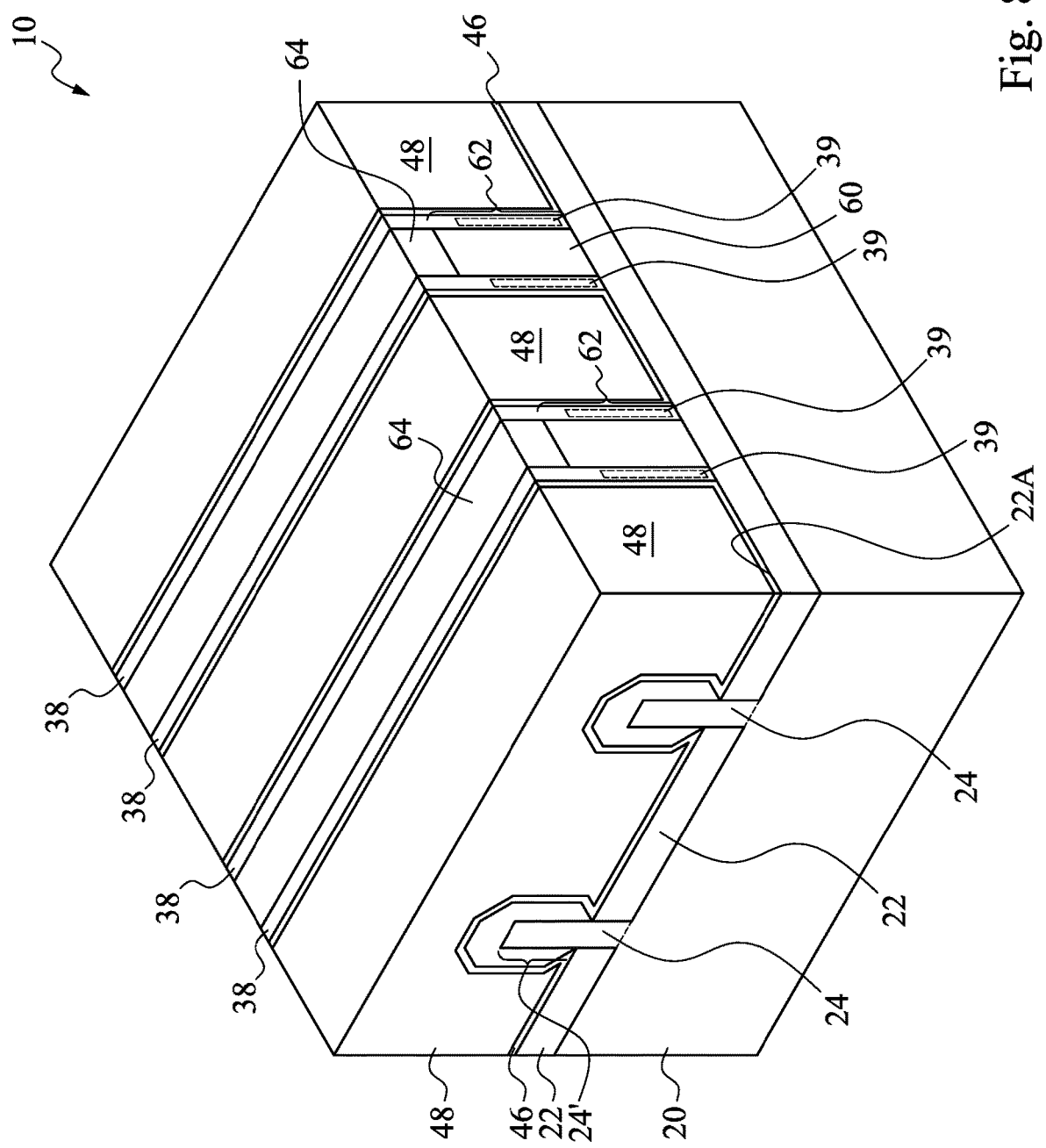

FIG. 8 illustrates the formation of self-aligned hard masks 64 in accordance with some embodiments. The self-aligned hard masks 64 are self-aligned to the underlying replacement gates 62, and are formed of a dielectric material such as $ZrO_2$, $Al_2O_3$, SiN, SiON, SiCN, $SiO_2$, or the like. The formation process may include etching replacement gates 62 to form recesses, filling the dielectric material into the recesses, and performing a planarization process to remove excess portions of the dielectric material.

In accordance with some embodiments of the present disclosure, if air gaps 39 have not been formed in preceding process steps, air gaps 39 may be formed after the formation of replacement gates 62 and hard masks 64. The processes for forming the corresponding air gaps 39 are shown in detail in FIGS. 20 through 25 and discussed accordingly. In accordance with alternative embodiments of the present disclosure, air gaps 39 are not formed in gate spacers 38 at this stage. Rather, air gaps 39 are formed in subsequent processes. Accordingly air gaps 39 are illustrated as dashed to indicate they may or may not exist at this stage.

Figure 9:
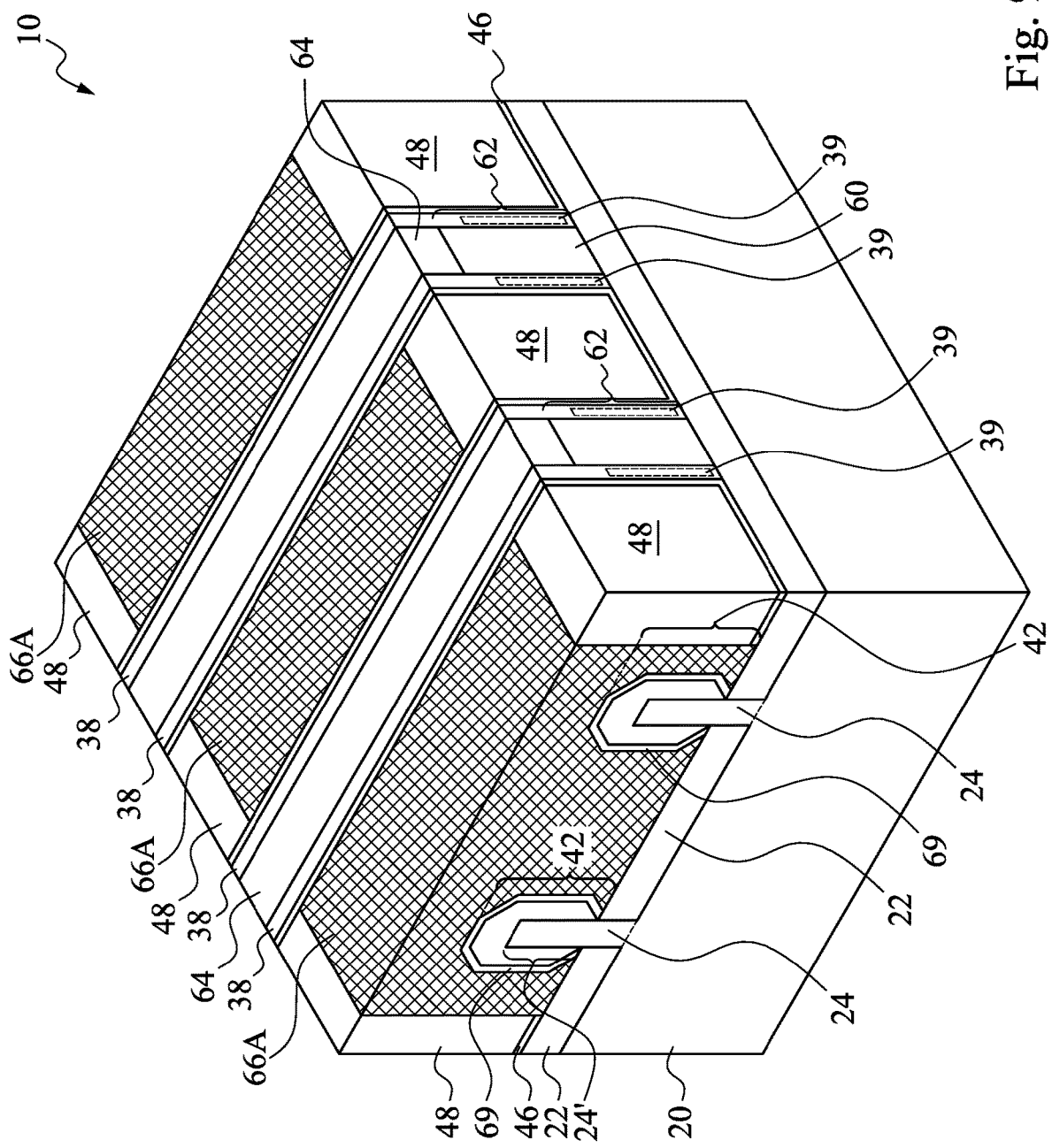

FIG. 9 illustrates the formation of source/drain contact plugs 66A and source/drain silicide regions 69. The respective step is illustrated as step 212 in the process flow 200 as shown in FIG. 38. The formation of source/drain contact plugs 66A may include etching ILD 48 and the underlying portions of CESL 46 to form contacting openings, siliciding the exposed portions of source/drain regions 42 to form silicide regions 69, filling the contact openings with a conductive layer(s), and performing a planarization. The resulting contact plugs 66A may include a conductive barrier layer formed of titanium, titanium nitride, tantalum, tantalum nitride, or the like, and a metal such as tungsten or cobalt over the conductive barrier layer. Source/drain contact plugs 66A may also be formed after a dielectric layer(s) (not shown) is formed over the structure in FIG. 9, and may include portions extending into the overlying dielectric layer(s).

In accordance with some embodiments of the present disclosure, if air gaps 39 have not been formed in preceding process steps, air gaps 39 may be formed after the formation of source/drain contact plugs 66A. The processes for forming the corresponding air gaps 39 are shown in detail in FIGS. 29 through 34 and discussed accordingly.

Figure 19A:
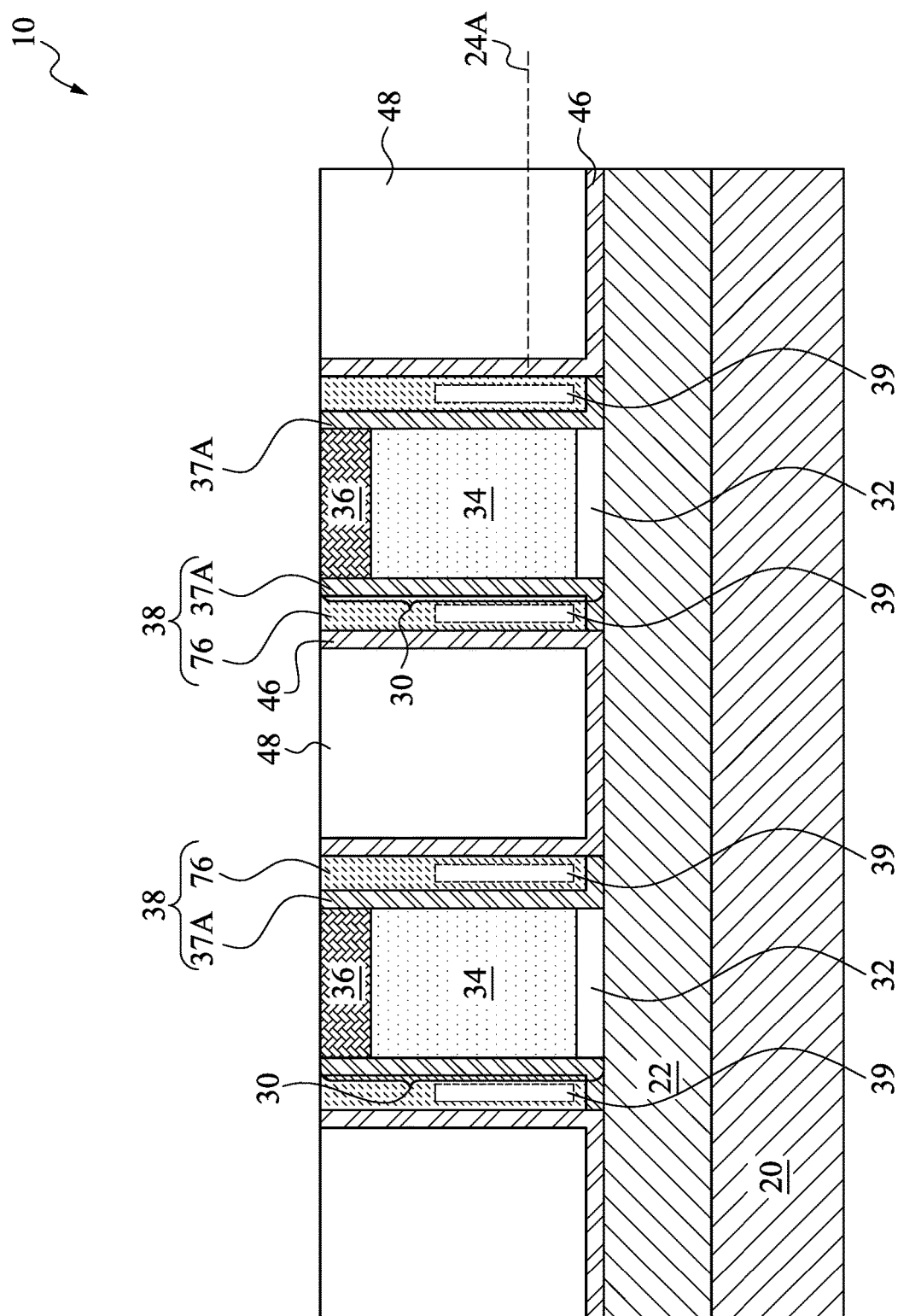
Figure 19B:
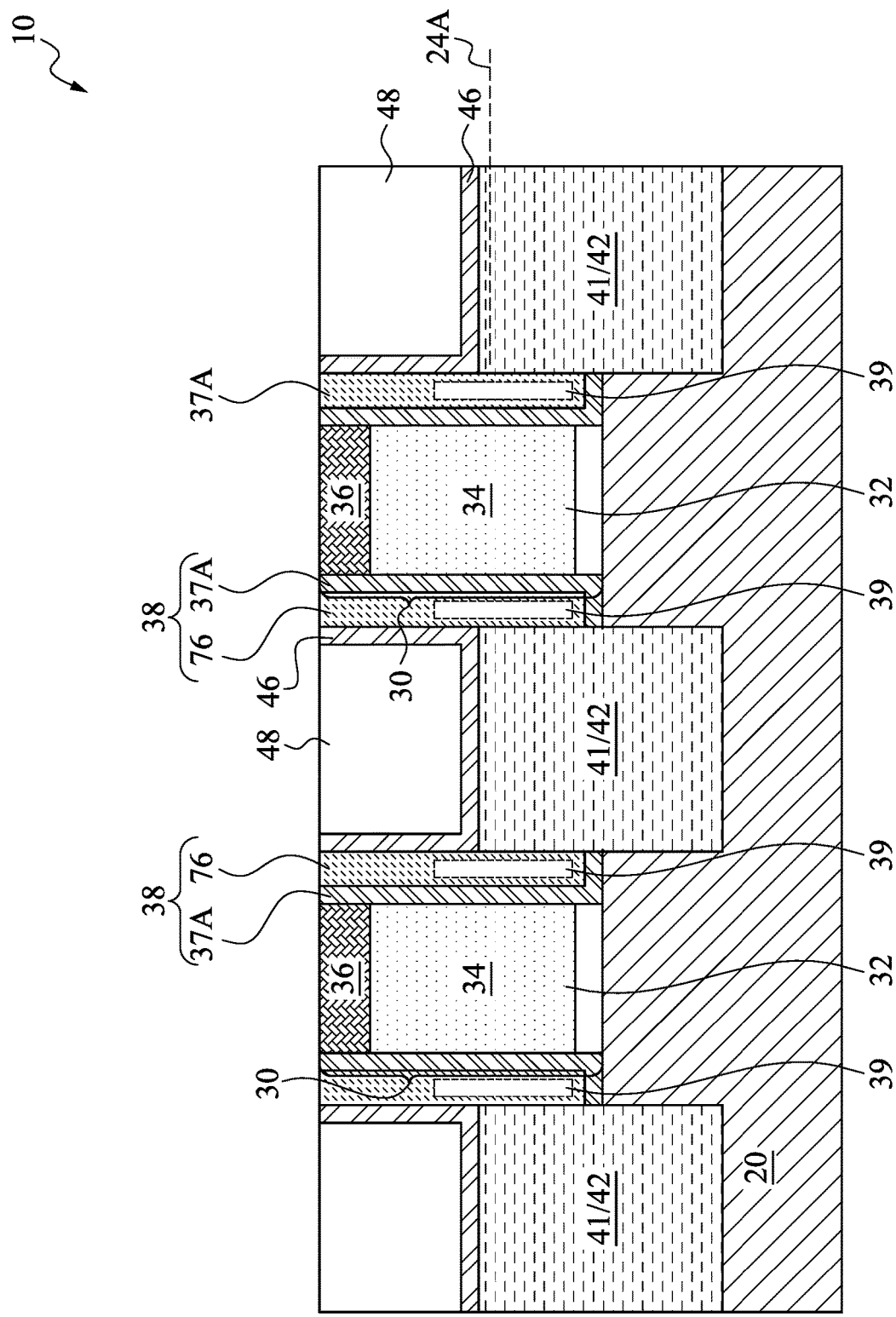
Figure 36:
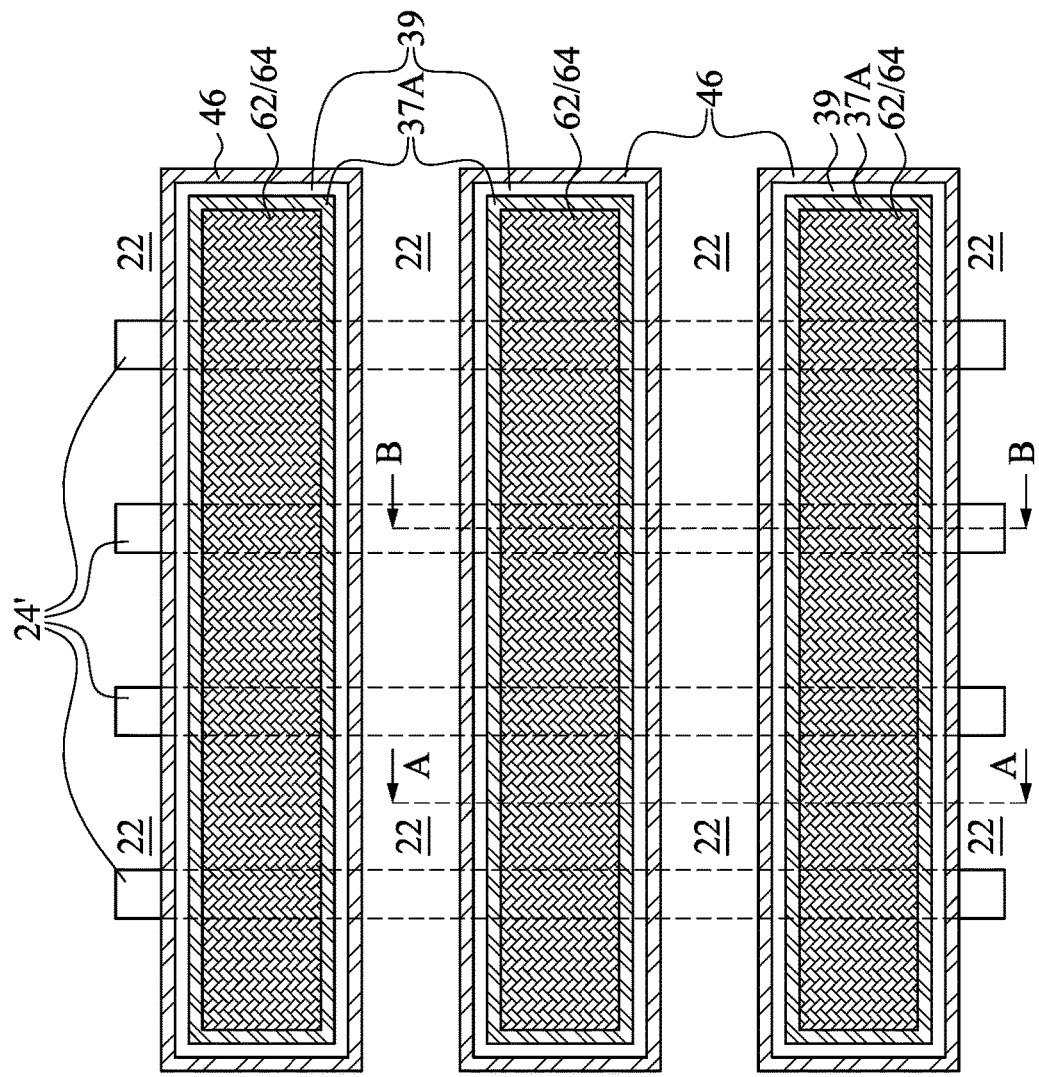
FIG. 36 illustrates a top view of a transistor having air gaps in gate spacers in accordance with some embodiments.

FIG. 36 illustrates a top view of some parts of the FinFET as shown in FIG. 9. In accordance with some embodiments of the present disclosure, a plurality of semiconductor fins 24' are laid out as parallel strips. A plurality of replacement gates 62 are formed as parallel strips crossing semiconductor fins 24'. Inner sidewall spacers 37A, which are parts of gate spacers 38, form rings encircling and contacting the sidewalls of replacement gates 62. Air gaps 39 also form rings encircling inner sidewall spacers 37A. The sidewall portions of CESL 46 form rings encircling air gaps 39. In accordance with some embodiments of the present disclosure, air gaps 39 are fully enclosed in another dielectric layer (for example, sealing layer 76 as shown in FIGS. 19A and 19B), which also form parts of gate spacers 38. Accordingly, inner sidewall spacers 37A and the sidewall portions of CESL 46 are spaced apart from air gaps 39 by the dielectric layer such as 76. In accordance with alternative embodiments of the present disclosure, air gaps 39 are exposed to either one, or both, of inner sidewall spacers 37A and the sidewall portions of CESL 46.

FIG. 36 illustrates two planes, with one containing line A-A, and the other containing line B-B. The plane containing line A-A is obtained between two neighboring fins 24', and hence fins 24' (and source/drain epitaxy regions 41/42) are not in the plane. The plane containing line B-B are obtained cutting through fin 24', and hence fin 24' (and source/drain epitaxy regions 41/42) are in the plane. In the following figures, all cross-sectional views with STI regions 22 illustrated are obtained from the plane containing line A-A in FIG. 36, and all cross-sectional views without STI regions 22 illustrated are obtained from the plane containing line B-B in FIG. 36.

FIGS. 10 through 17, 18A, 18B, 19A, and 19B are cross-sectional views of intermediate stages in the formation of air gaps before source/drain epitaxy in accordance with some embodiments. Line 24A is illustrated throughout the cross-sectional views to indicate the top position of semiconductor fins 24'. The steps shown in FIG. 10 through 17 correspond to the step shown in FIG. 3. The steps shown in FIGS. 18A and 18B correspond to the steps shown in FIGS. 4, 5A, and 5B. The steps shown in FIGS. 19A and 19B correspond to the step shown in FIG. 6.

Figure 10:
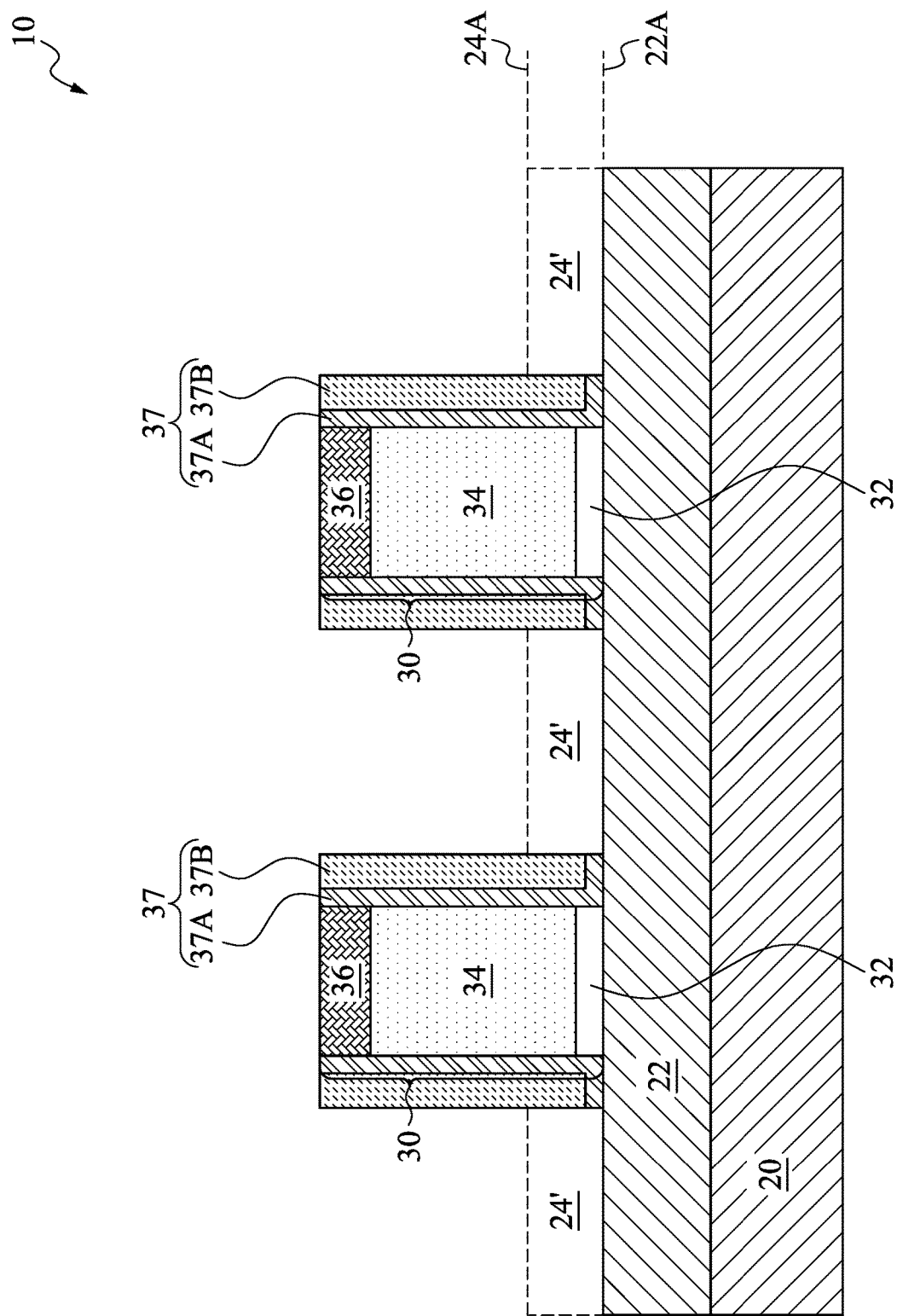
FIGS. 10 through 17, 18A, 18B, 19A, and 19B are cross-sectional views of intermediate stages in the formation of air gaps in gate spacers before source/drain epitaxy in accordance with some embodiments.

FIG. 10 illustrates dummy gate stack 30, which includes dummy gate dielectric 32, dummy gate electrode 34, and dummy mask 36. Gate spacers 37 are formed on the sidewalls of dummy gate stack 30. Gate spacers 37 is alternatively referred to as a dummy gate spacer since pails 37B of gate spacers 37 will be removed. The cross-sectional view shown in FIG. 10 is obtained from a plane same as the plane containing line A-A in FIG. 36. Since semiconductor fin 24' is not in the plane, semiconductor fin 24' is shown as dashed in FIG. 10. In the cross-sectional view, the level of the top surfaces 24A of fins 24' are illustrated, and semiconductor fins 24' are at the level between 24A and the top surfaces of STI regions 22. Gate spacers 37 include inner sidewall spacers/portions 37A, and dummy spacer portions 37B. Portions 37A and 37B are formed of different materials, which may be selected from $SiO_2$, SiN, SiCN, SiON, SiOCN, SiC, or the like. When formed of SiOCN, inner sidewall spacers 37A may have a carbon atomic percentage greater than about 10 percent, and dummy spacer portions 37B may have a carbon atomic percentage lower than about 10 percent. Dummy spacer portions 37B may also be formed of TiN or the composite layer of $SiO_2$ and SiOCN. Dummy spacer portions 37B may overlap the horizontal legs of inner sidewall spacers 37A. The thickness of sidewall portions 37A may be in the range between about 2 nm and about 5 nm. The thickness of dummy spacer portions 37B may be in the range between about 2 nm and about 6 nm.

Figure 11:
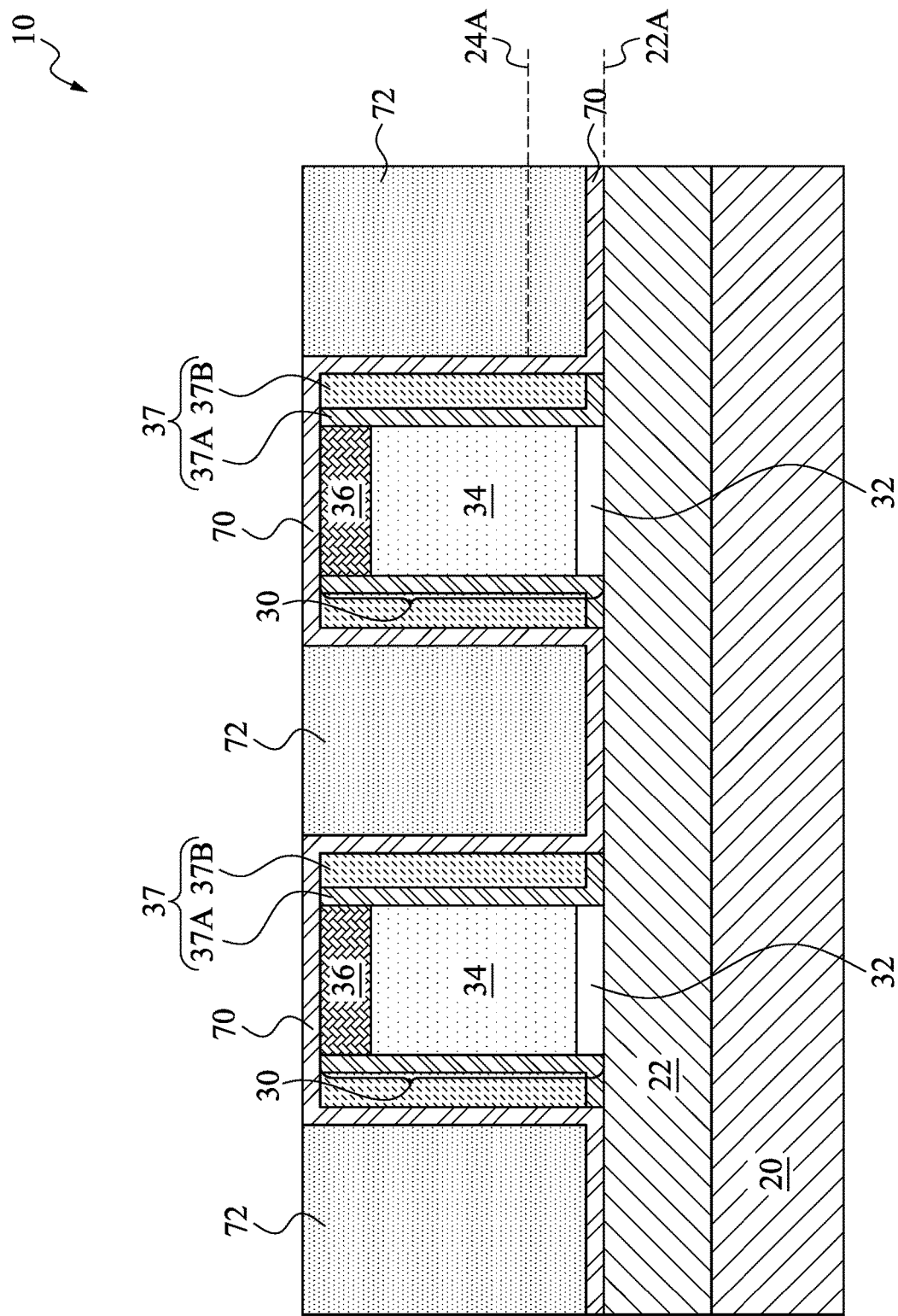

FIG. 11 illustrates the formation of buffer dielectric layer 70 and sacrificial filling material 72. In accordance with some embodiments, buffer dielectric layer 70 is formed of a material different from the materials of portions 37A and 37B. A conformal deposition method such as Atomic Layer Deposition (ALD) or CVD may be used for depositing either one of dielectrics 70 and 72. Buffer dielectric layer 70 and sacrificial filling material 72 may also be formed of $SiO_2$, SiN, SiCN, SiON, SiOCN, SiC, or the like. A planarization process such as a CMP process or a mechanical grinding process is performed, and buffer dielectric layer 70 may be used as a CMP stop layer. Furthermore, filling material 72 are formed of a material different from the materials of hard mask 36, gate spacers 37, and buffer dielectric layer 70.

Figure 12:
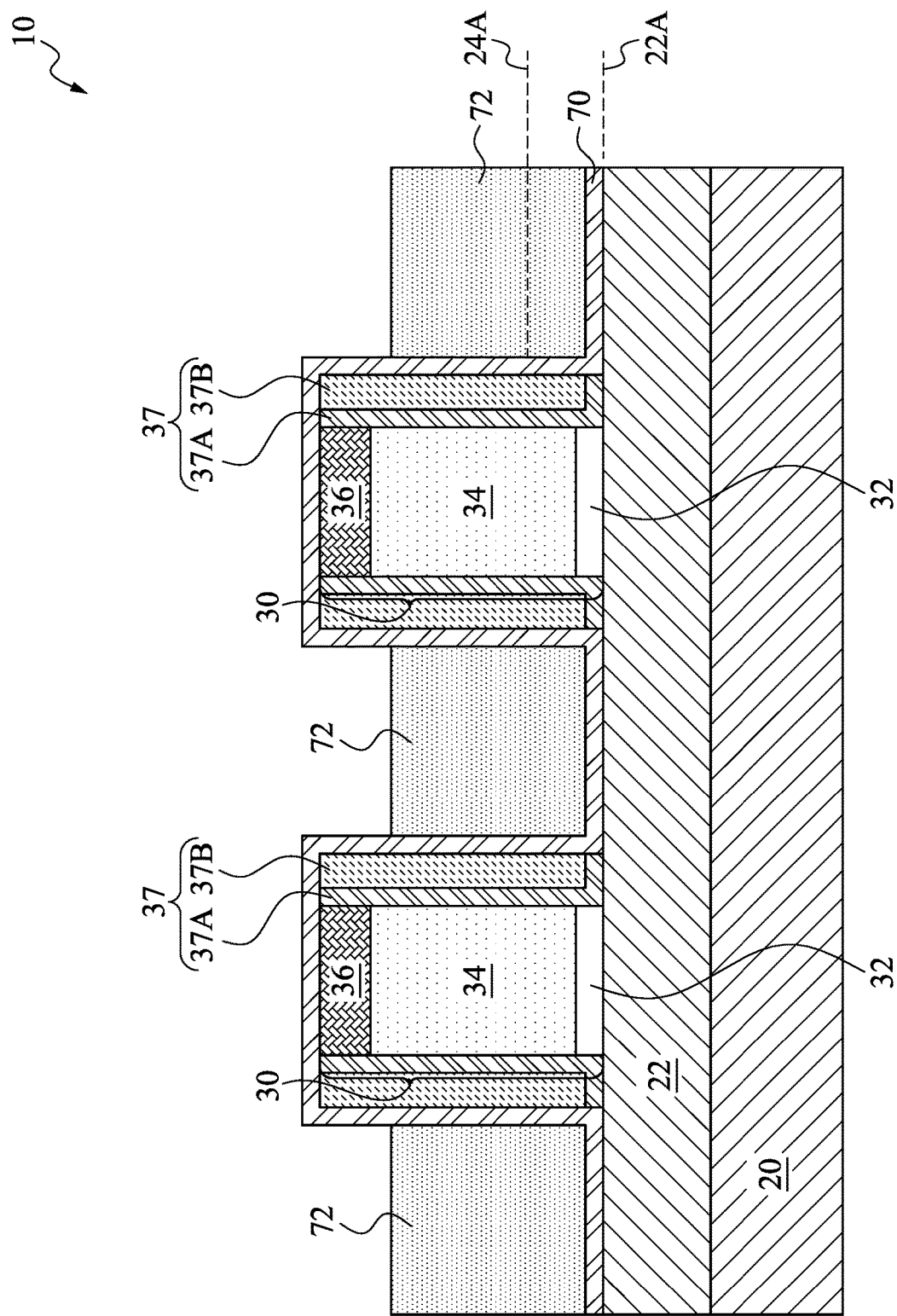
Figure 13:
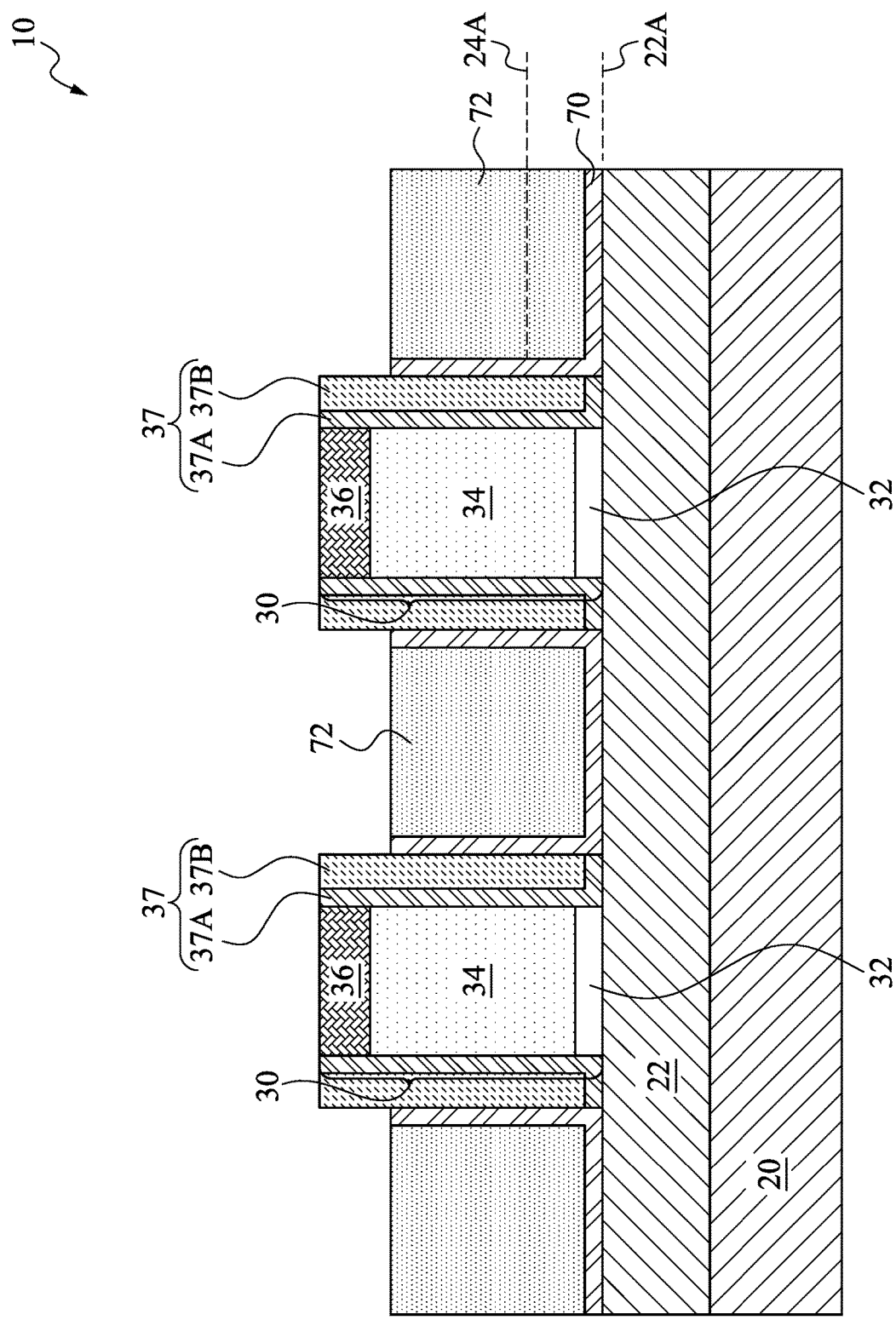

Next, referring to FIG. 12, sacrificial filling material 72 is etched back. The level of the top surface of sacrificial filling material 72 partially determines the height of the subsequently formed air gaps 39 (FIG. 11). Some portions of buffer dielectric layer 70 are exposed. The exposed portions of buffer dielectric layer 70 are then etched, revealing the top edges of inner sidewall spacers 37A and dummy spacer portions 37B, as shown in FIG. 13. In the etching, the etching selectivity values, which is the ratio of the etching rate of filling material 72 to the etching rates of materials of hard mask 36, gate spacers 37, and buffer dielectric layer 70 are high, for example, higher than about 60, and may be higher than about 100. Accordingly, hard mask 36, gate spacers 37, and buffer dielectric layer 70 are not etched.

Figure 14:
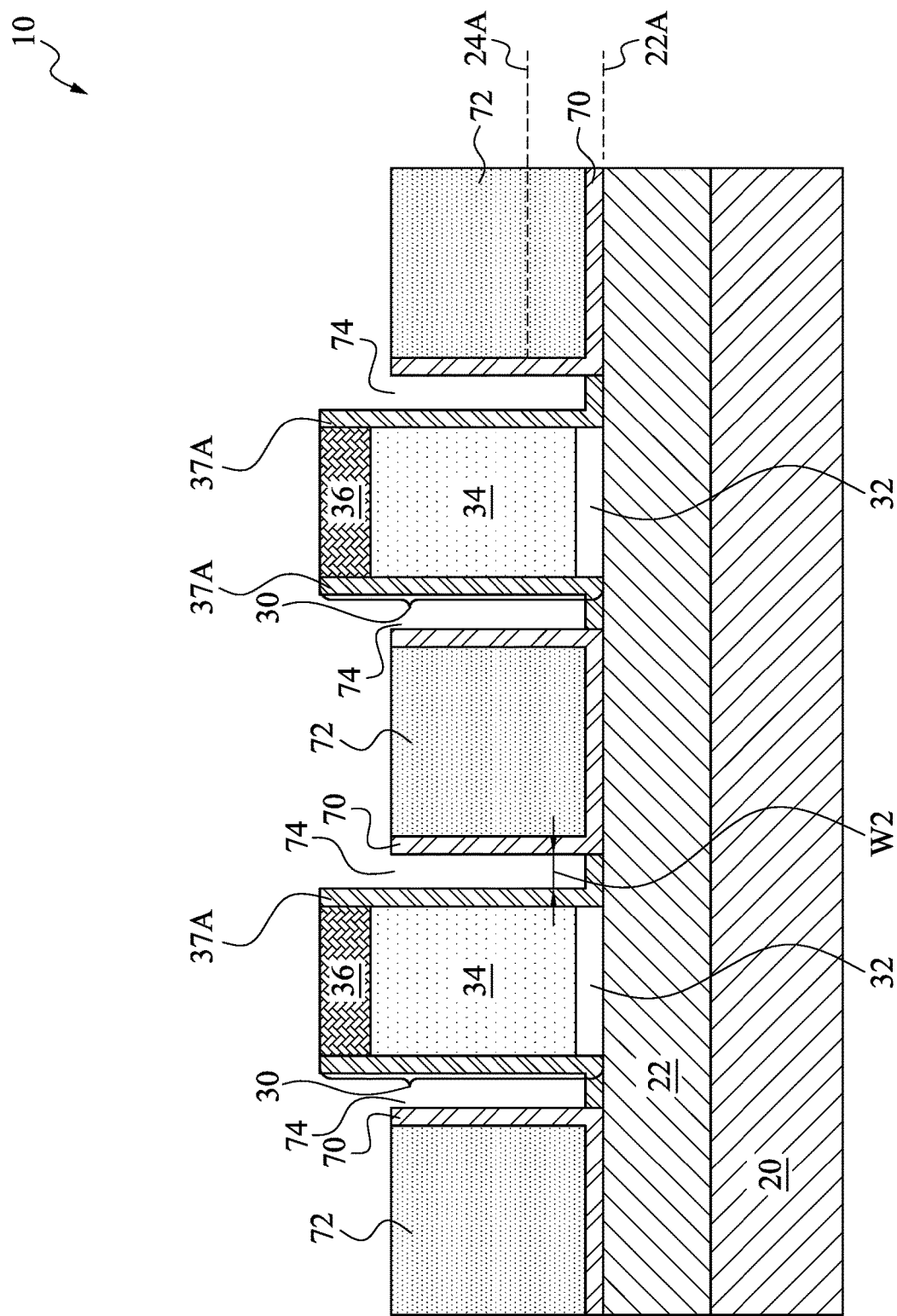

The dummy spacer portions 37B of gate spacers 37 are then removed in an etching step. The etching may be performed using dry etching or wet etching. The etchant is selected not to attack the exposed features 37A, 70, 72, 36, and possibly 34. Accordingly, trenches 74 are formed, as shown in FIG. 14. Trenches 74, when viewed in a top view, will be a ring encircling dummy gate 30 and the inner sidewall spacer 37A. In accordance with some embodiments, dummy spacer portions comprise silicon oxide, and are etched using the combination of $NF_3$, HF, and water ($H_2O$). Other etchant such as SiCONi ($NF_3$ and $NH_3$), Certas (HF and $NH_3$), and HF may also be used. In the formation of trenches 74, the etchant is selected so that hard masks 36, inner sidewall spacers 37A, buffer dielectric layer 70, and filling material 72 are not damaged.

Figure 15:
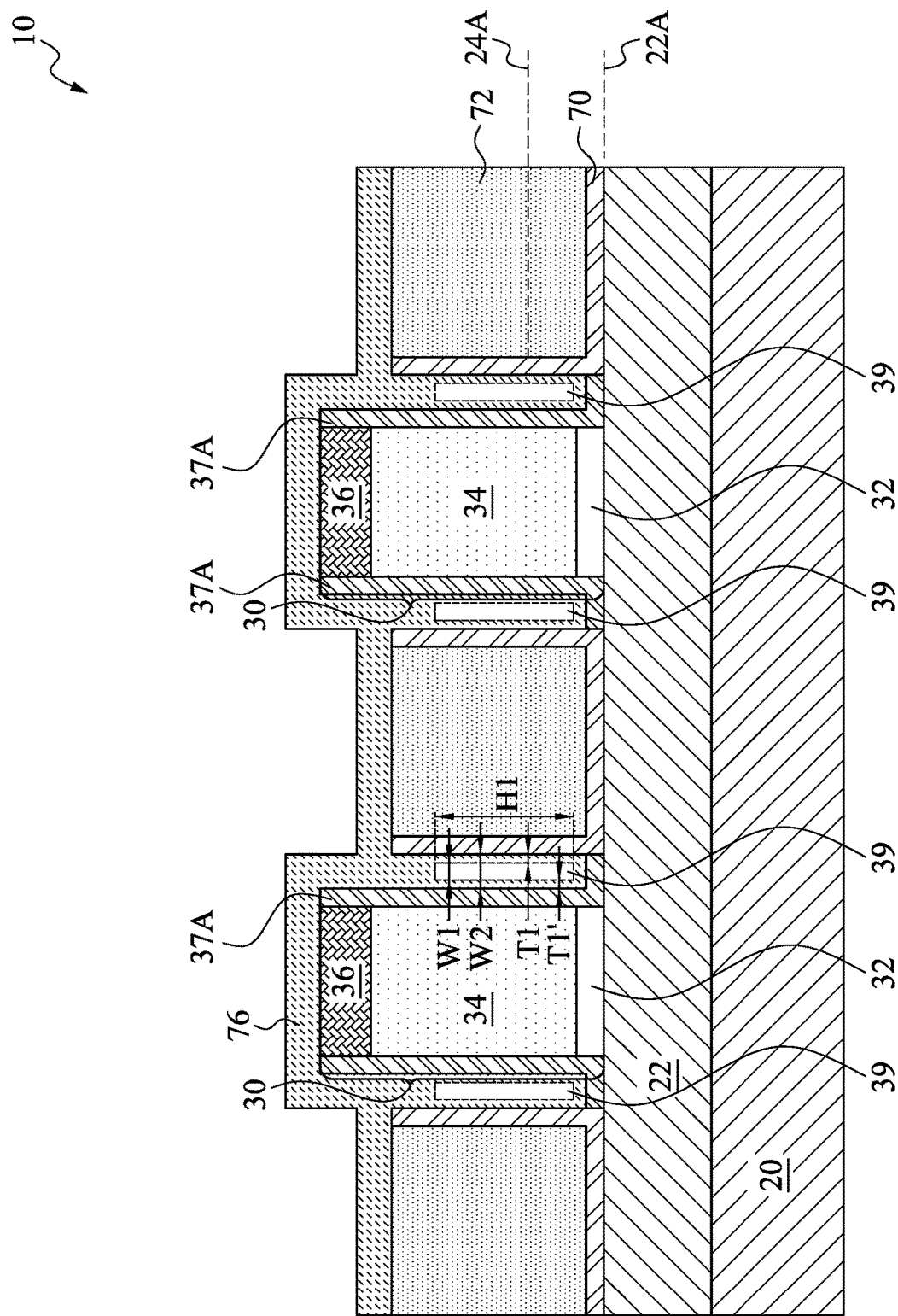

FIG. 15 illustrates the formation of dielectric sealing layer 76. Dielectric sealing layer 76 may be formed of SiOC or silicon nitride, for example, and other dielectric material different from the materials of buffer dielectric layer 70 and sacrificial filling material 72 may also be used. In accordance with some embodiments, the formation of dielectric sealing layer 76 includes a conformal deposition process such as ALD or CVD, followed by a non-conformal deposition process such as PECVD. The conformal process results in a conformal layer to be deposited on the sidewalls of inner sidewall spacer 37A and the sidewalls of buffer dielectric layer 70, with air gap 39 therebetween. The non-conformal deposition process seals the top portion of the trench 74 (FIG. 14). Accordingly, air gaps 39 are formed, and are enclosed by dielectric sealing layer 76. In accordance with some embodiments of the present disclosure, air gaps 39 have heights H1 greater than about 75 nm, and may be in the range between about 75 nm and 500 nm, depending on the height of dummy gate 34. The width W1 of air gaps 39 may be in the range between about 2 nm and about 5 nm.

In FIG. 15 and subsequent FIGS. 19A, 19B, 26A, 26B, 35A, and 35B, the shapes of air gaps 39 are schematically shown as having rectangular cross-sectional views. It is appreciated that when the surrounding dielectric materials such as sealing layer 76 are formed using different materials and/or methods, air gaps 39 as in these figures may have different shapes. FIG. 37 illustrates the possible shapes of air gaps 39 in accordance with some embodiments. For example, air gaps 39 may have the shape of water droplet, ellipse shape, rectangular shape with corners rounded, etc.

In accordance with some embodiments, the sidewall portion of sealing layer 76 has thicknesses T1 and T1', which may be in the range between about 1 nm and about 3 nm. The ratios T1/W2 and T1'/W2 may be in the range between about 0.3 and about 0.5, wherein W2 is the width of trenches 74 (FIG. 14).

Figure 16:
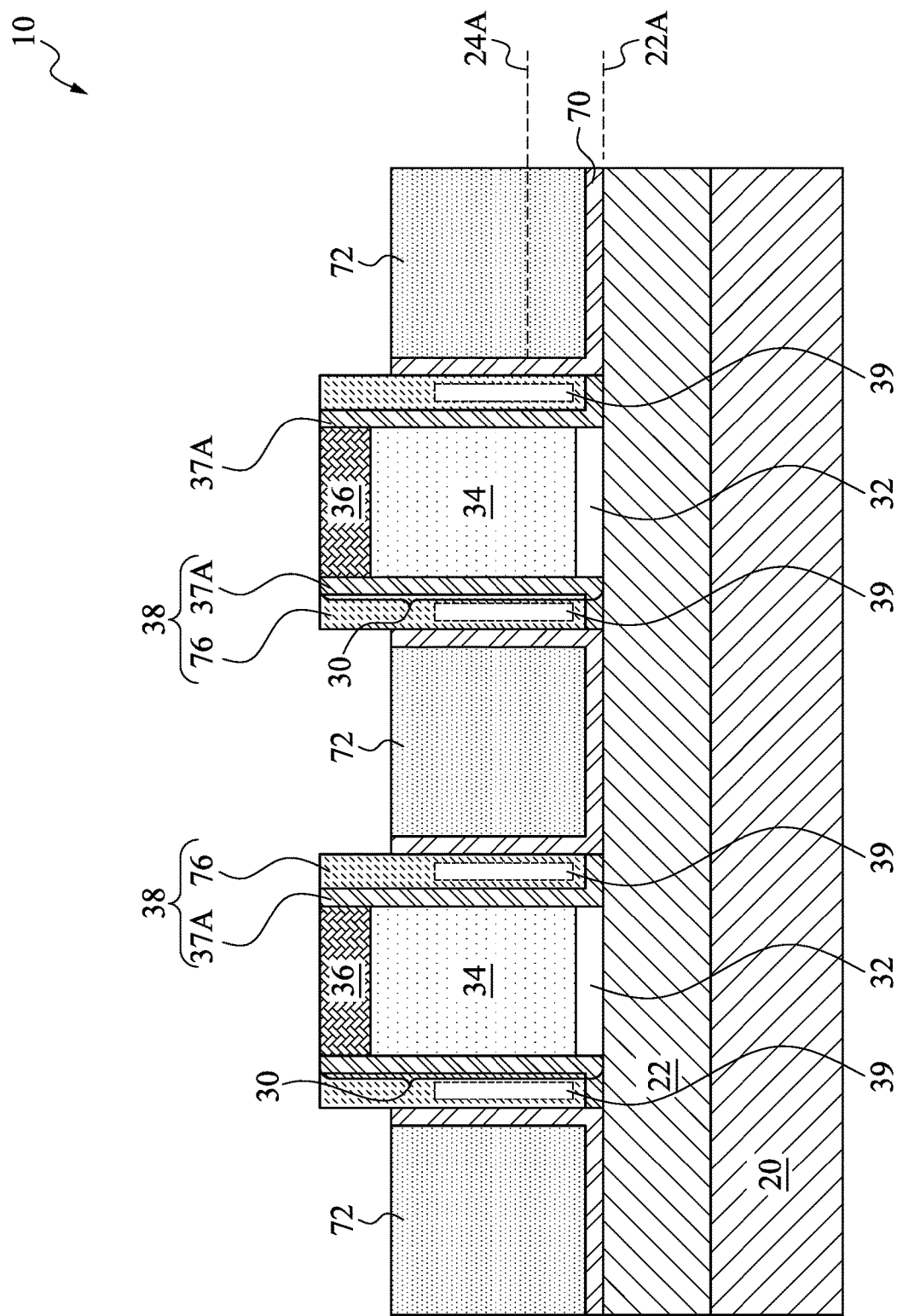

An anisotropic etch is then performed on dielectric sealing layer 76, and the resulting structure is shown in FIG. 16. In accordance with some embodiments of the present disclosure, the etching includes a dry etching process performed using process gases such as $CF_4/O_2/N_2$ (the mixture of $CF_4$, $O_2$, and $N_2$), $NF_3/O_2$, $SF_6$, $SF_6/O_2$, or the like. The horizontal portions of dielectric sealing layer 76 are thus removed. Some vertical portions of dielectric sealing layer 76 remain to seal air gaps 39. Throughout the description, inner sidewall spacers 37A, dielectric sealing layer 76, and air gaps 39 are in combination referred to gate spacers 38.

Figure 17:
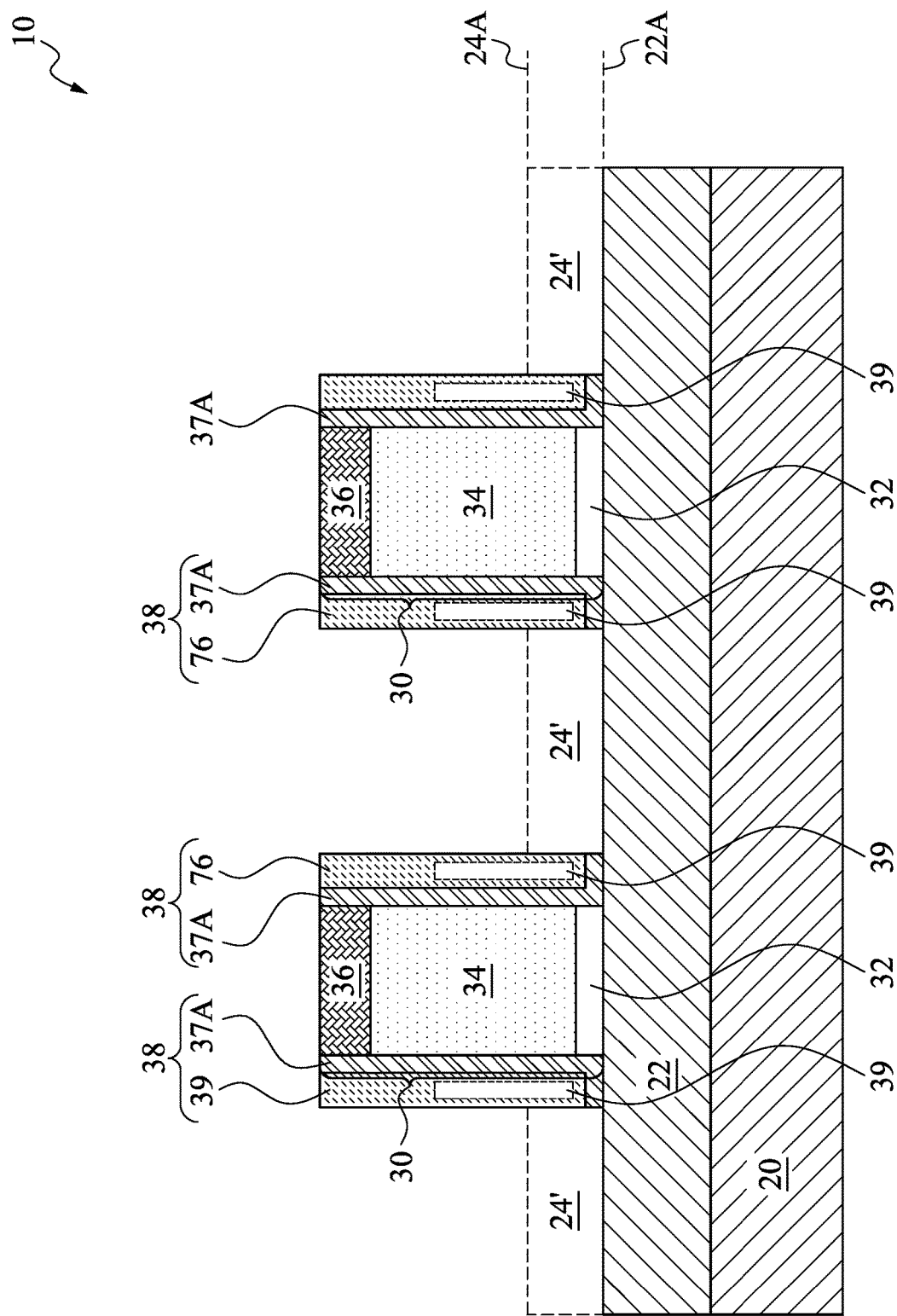

Next, the remaining portions of buffer dielectric layer 70 and sacrificial filling material 72 are removed in etching steps. The resulting structure is shown in FIG. 17. The sidewalls of dielectric sealing layer 76 are exposed. Also, semiconductor fins 24' are revealed again. FIG. 17 also illustrates a cross-sectional view of the structure shown in FIG. 3. In the etching, due to the difference between buffer dielectric layer 70 and layers 70 and 72 and the selection of an appropriate etching chemical, the etching selectivity values are high, so that dielectric sealing layer 76 are not damaged. The etching may be wet etching or dry etching. The etching selectivity values are the ratios of the etching rate of layers 70 and 72 to the etching rate of dielectric sealing layer 76. For example, the etching ratios are higher than about 100 in accordance with some embodiments of the present disclosure.

Figure 18A:
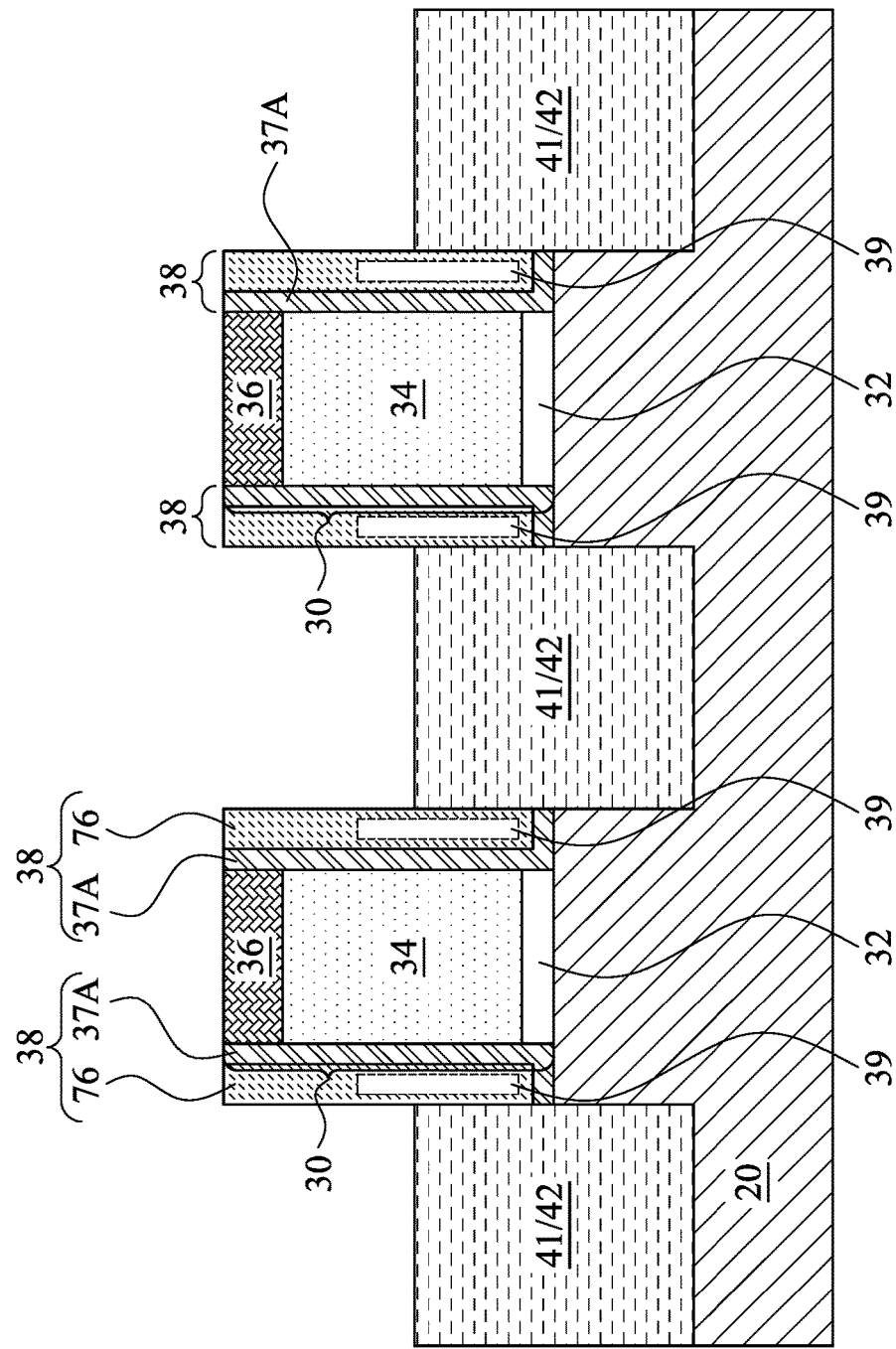

In subsequent steps, source/drain regions 42 are formed, and FIG. 18A illustrates a cross-sectional view of source/drain regions 42. The cross-sectional view shown in FIG. 18A is obtained from a plane same as the plane containing line B-B in FIG. 36. The formation of source/drain regions 42 are also discussed referring to FIGS. 4, 5A, and 5B.

Figure 18B:
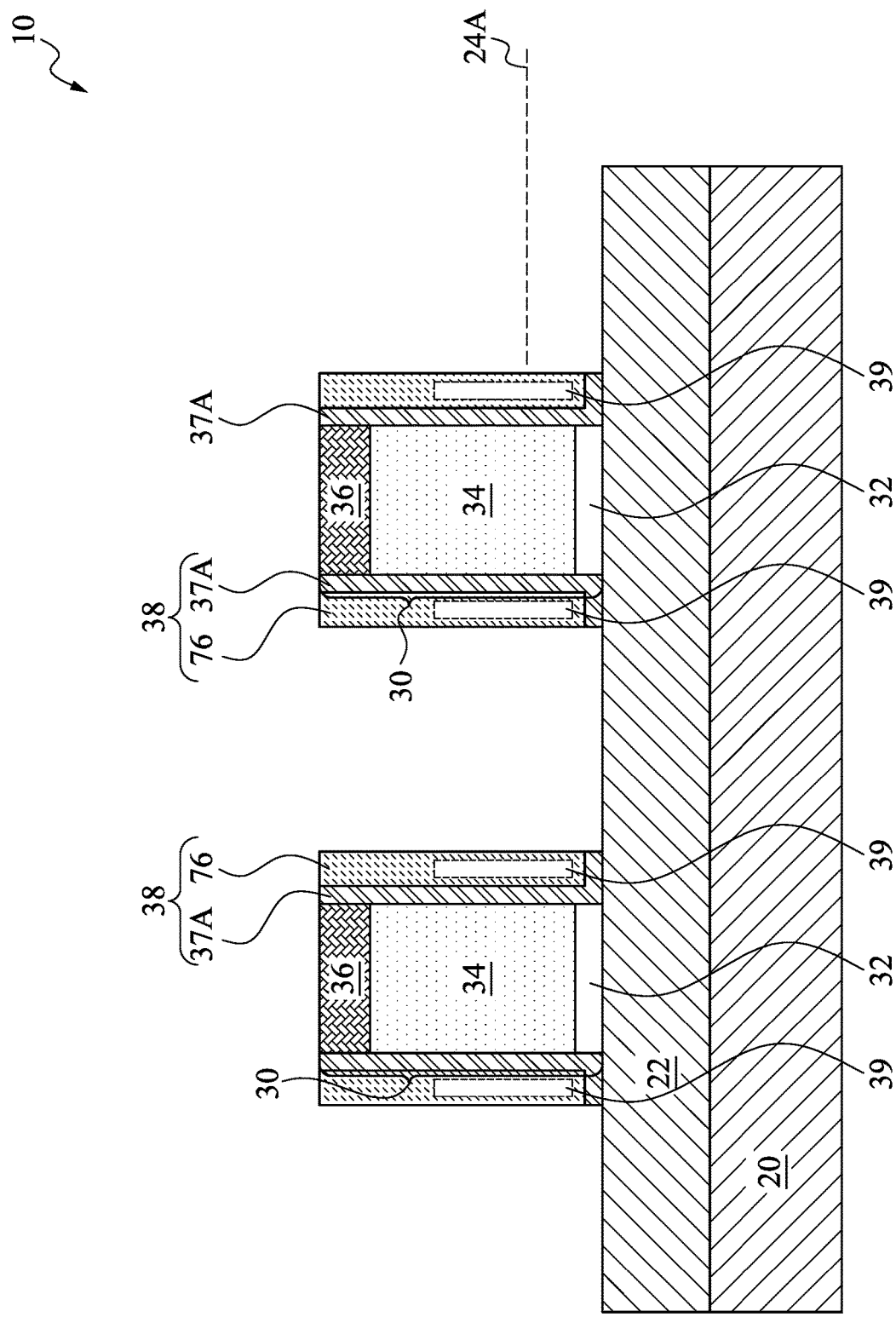

FIG. 18B illustrates the cross-sectional view obtained from the plane containing line A-A in FIG. 36 after the formation of source/drain regions 42. Since source/drain regions 42 are not in the plane, they are not illustrated. Instead, STI region 22 is in this plane, and is shown in FIG. 18B.

FIGS. 19A and 19B illustrate the formation of CESL 46 and ILD 48, followed by a planarization process to level the top surface of CESL 46 and ILD 48 with the top surface of gate spacers 38. FIGS. 19A and 19B show the different cross-sectional views of the same step. FIG. 19A illustrates the cross-sectional view obtained from the plane that contains line A-A in FIG. 36. FIG. 19B illustrates the cross-sectional view obtained from the plane that contains line B-B in FIG. 36. The perspective view of this structure is shown in FIG. 6.

FIGS. 20 through 25 illustrate the intermediate stages in the formation of air gaps 39 (FIG. 25) after the formation of replacement gates and before the formation of source/drain contact plugs in accordance with some embodiments. In accordance with these embodiments, the processes shown in FIGS. 1 through 7 are performed, in which the steps shown in FIGS. 10 through 19A/19B are skipped. Accordingly, in FIG. 7, air gaps 39 have not been formed yet, and will be formed in the processes shown in FIGS. 20 through 25, discussed as follows.

Figure 20:
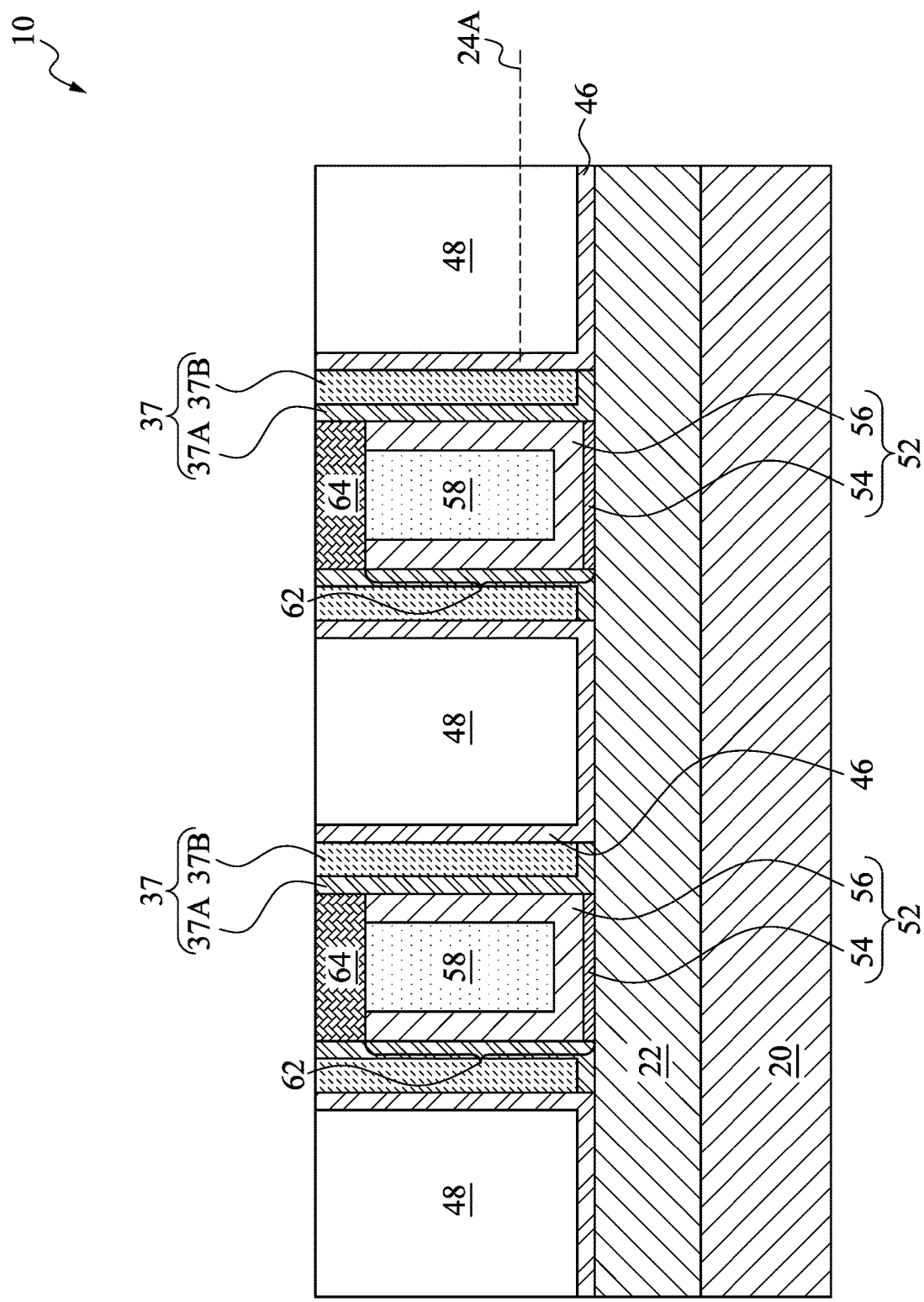
FIGS. 20 through 25, 26A, and 26B are cross-sectional views of intermediate stages in the formation of air gaps in gate spacers after the formation of replacement gates in accordance with some embodiments.

The cross-sectional view of the structure shown in FIG. 7 is also illustrated in FIG. 20. FIG. 20 illustrates gate dielectric 52, which includes interfacial layer 54 and high-k dielectric layer 56. Gate electrode 58 and gate dielectric 52 in combination form replacement gate 62. Hard mask 64 overlaps replacement gate 62.

Figure 21:
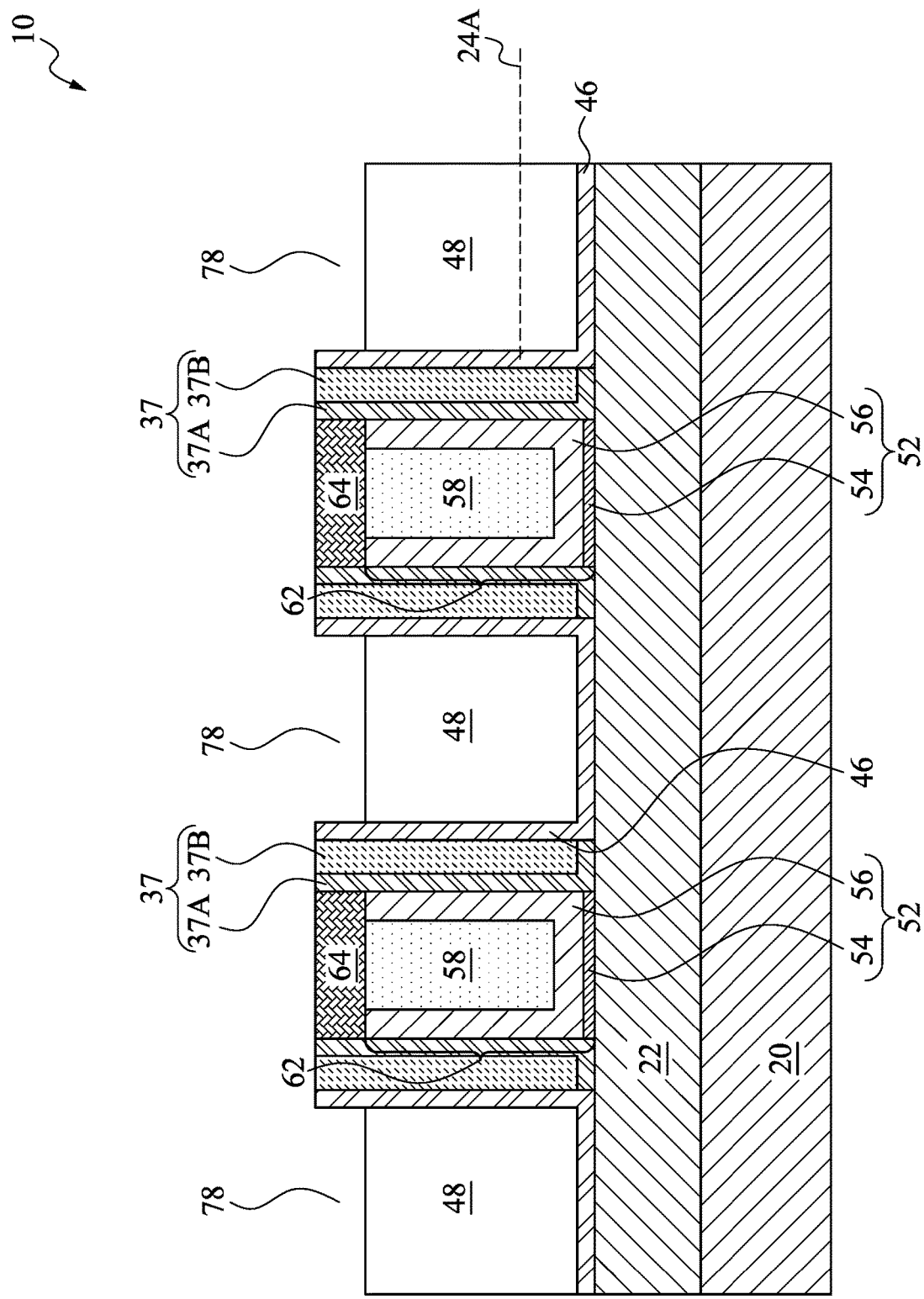
Figure 22:
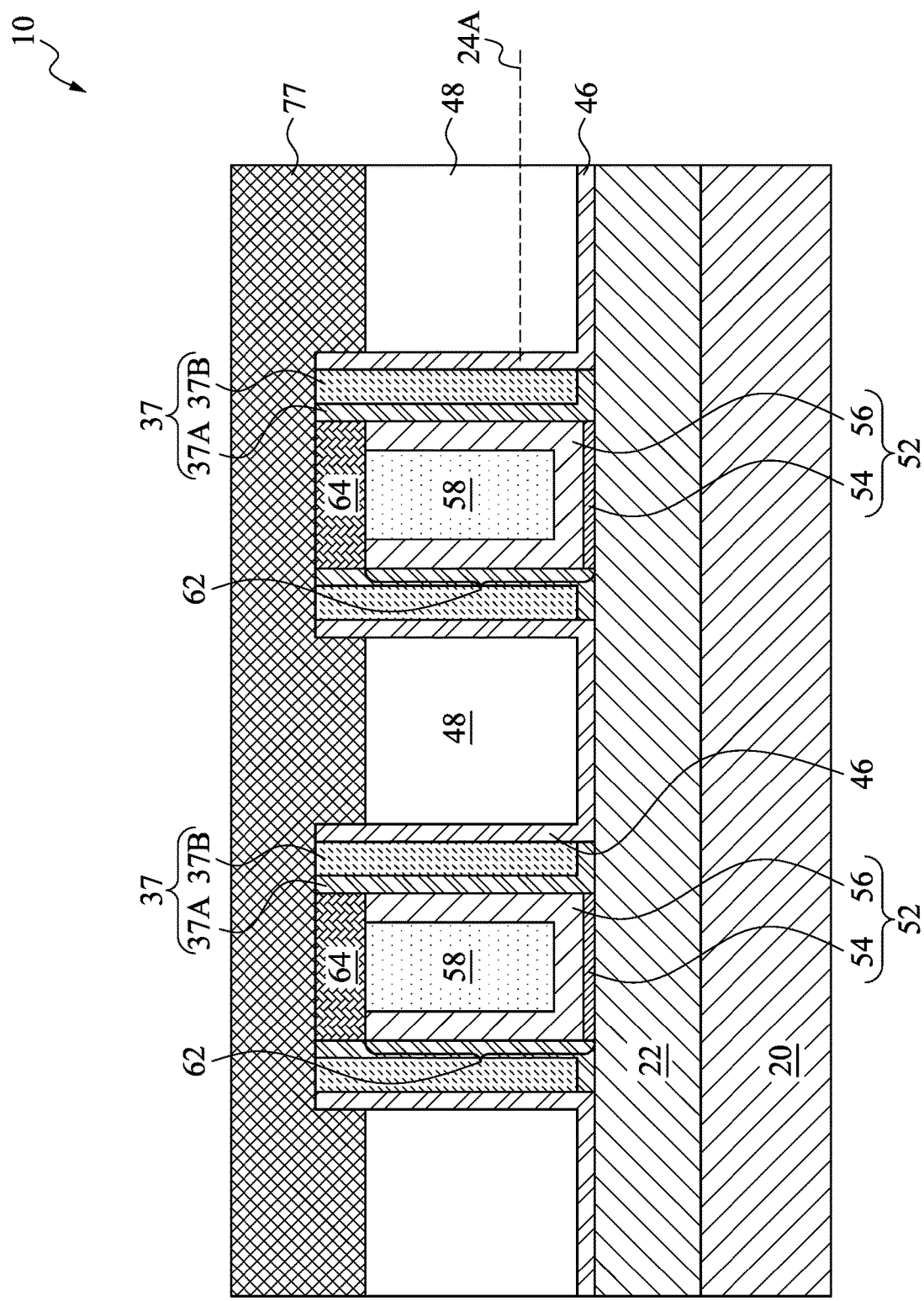

Next, referring to FIG. 21, ILD 48 is recessed in an etching step, forming recesses 78. Next, protection layer 77 is formed, as shown in FIG. 22. Protection layer 77 is formed of a material different from the material of dummy spacer portions 37B, and different from the material of ILD 48. In accordance with some embodiments of the present disclosure, protection layer 77 is formed of SiOC or another type of dielectric material such as SiN, SiCN, or SiC. A planarization process is then performed to form the structure shown in FIG. 23, and the top edges of dummy spacer portions 37B are revealed. The resulting protection layer 77 may have a thickness T2 in the range between about 5 nm and about 10 nm. In accordance with some embodiments of the present disclosure. Furthermore, the ratio T2/H2 may be in the range between about 0.05 and about 0.1 in accordance with some embodiments, wherein H2 is the combined height of ILD 48 and protection layer 77.

Figure 24:
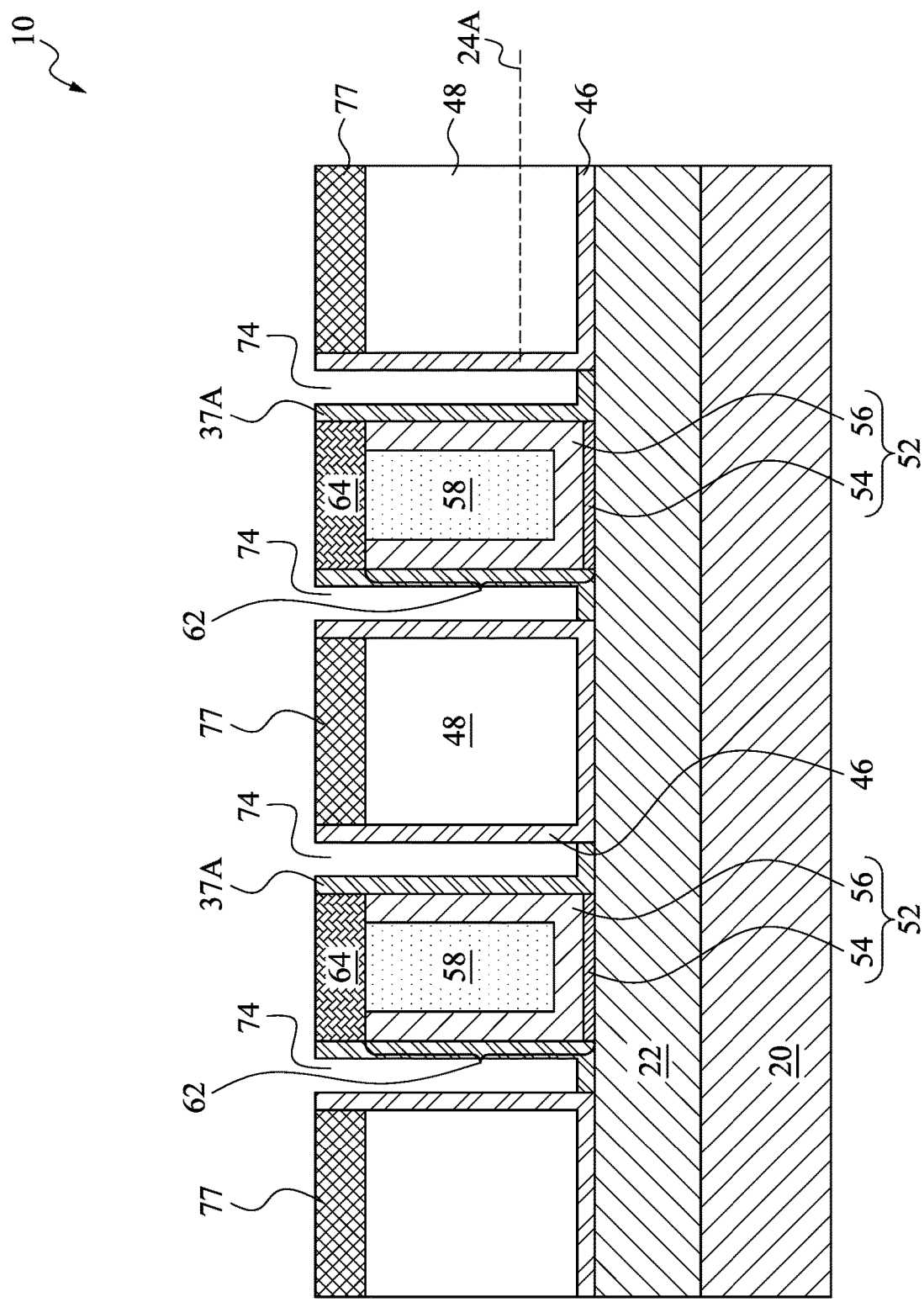
Figure 25:
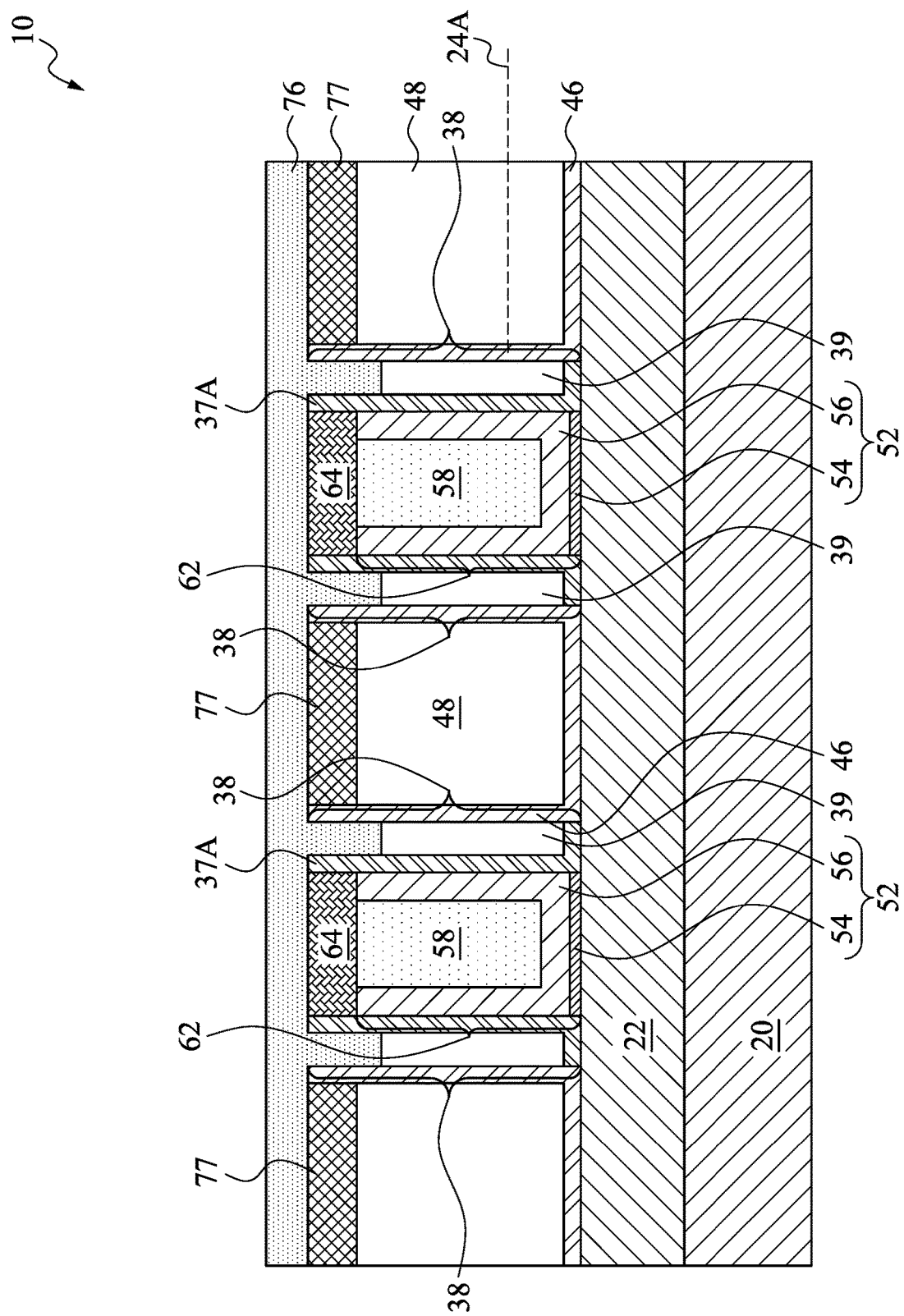

Next, dummy spacer portions 37B are etched, forming trenches 74 as shown in FIG. 24. The etching process may be similar to what are discussed referring to FIG. 14, and hence is not repeated herein. Trenches 74 also form rings encircling the corresponding replacement gates 62. In a subsequent process, dielectric sealing layer 76 is formed, as shown in FIG. 25. In accordance with some embodiments of the present disclosure, dielectric sealing layer 76 is formed using a non-conformal deposition method such as PECVD, so that air gaps 39 are sealed therein. It is appreciated that air gaps 39 may have different shapes than illustrated. For example, air gaps 39 may have the shapes shown in FIG. 37 or other shapes.

In accordance with some embodiments of the present disclosure, the top surfaces and sidewall surfaces of spacers 37A and CESL 46 have at least some portions exposed to air gaps 39. Dielectric sealing layer 76 may also partially or fully cover the top surfaces and the sidewall surfaces of inner sidewall spacers 37A and CESL 46, so that air gaps 39 are fully enclosed in dielectric sealing layer 76, similar to what are shown in FIGS. 19A and 19B. The corresponding deposition of dielectric sealing layer 76 may include a conformal deposition process (such as ALD or CVD), followed by a non-conformal deposition process such as PECVD. Alternatively, dielectric sealing layer 76 is formed in a non-conformal deposition process. A planarization process is then performed. The top surface of the remaining dielectric sealing layer 76 may be higher than or level with the top surfaces of inner sidewall spacers 37A. The structure shown in FIG. 25 also corresponds to the structure shown in FIG. 8. Throughout the description, inner sidewall spacers 37A, dielectric sealing layer 76, and air gaps 39 in combination form gate spacers 38.

Figure 26A:
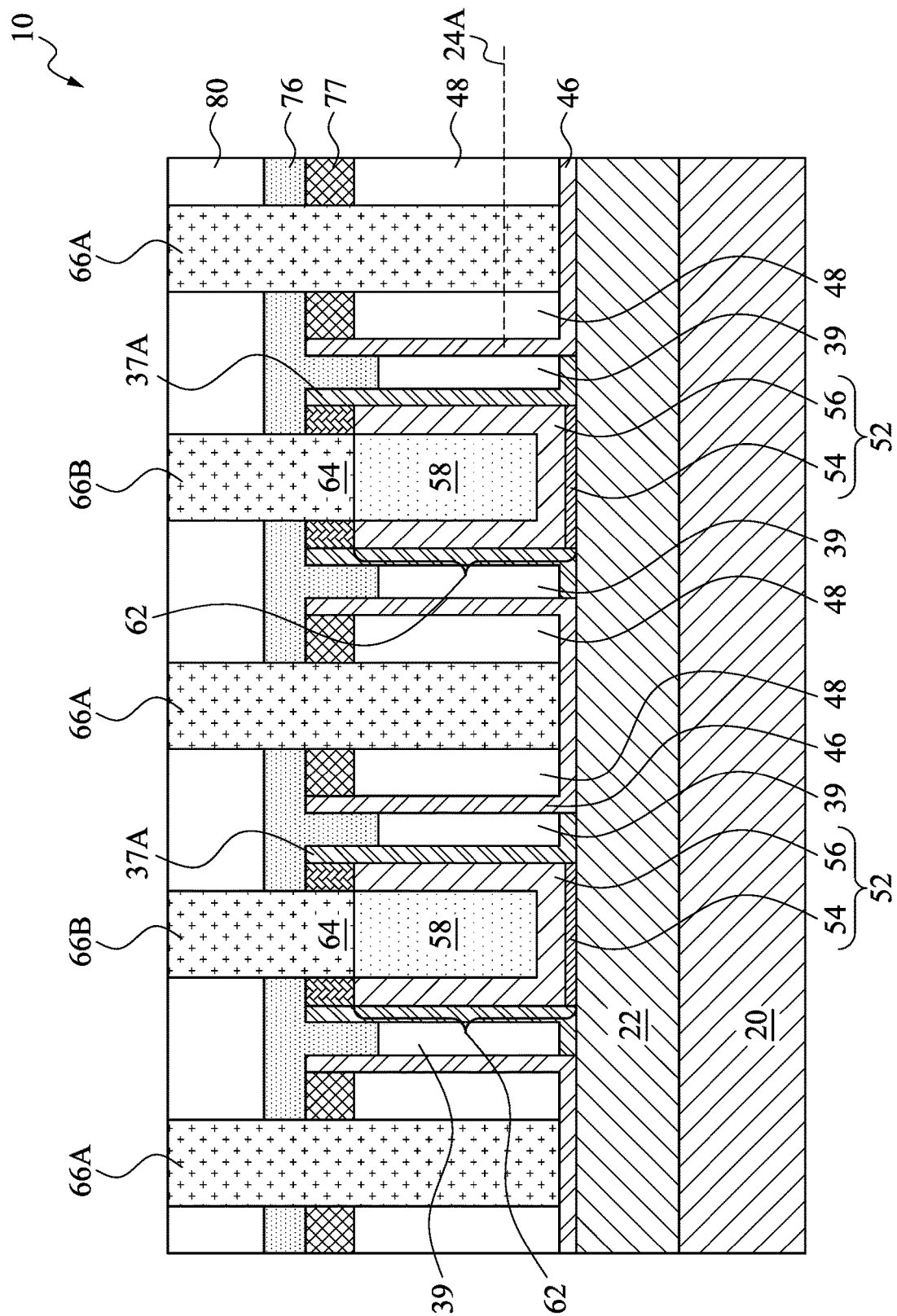
Figure 26B:
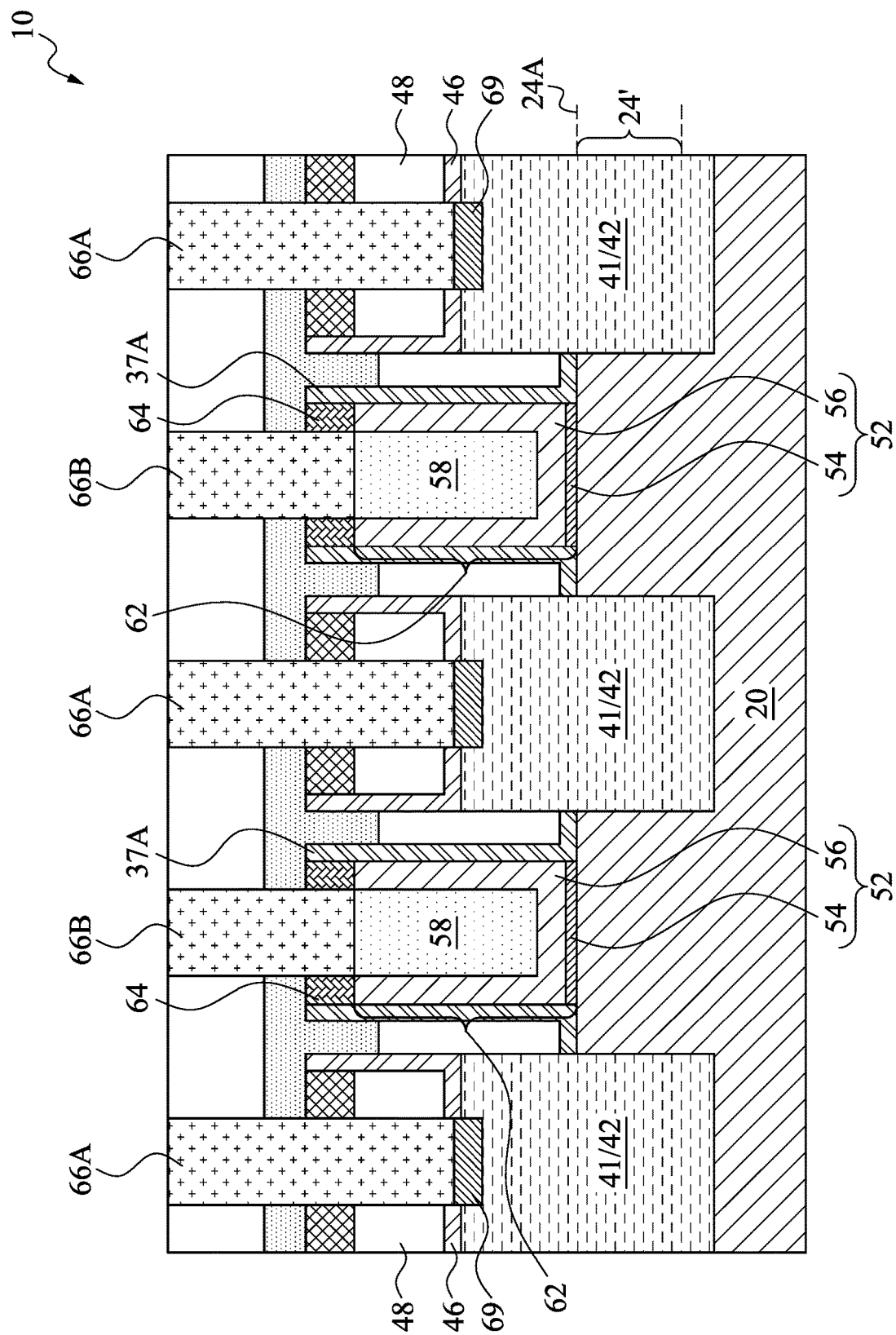

FIGS. 26A and 26B illustrate the formation of ILD 80, source/drain contact plugs 66A, and gate contact plugs 66B, followed by a planarization process. FIGS. 26A and 26B show the different cross-sectional views of the same step. FIG. 26A illustrates the cross-sectional view obtained from the plane that contains line A-A in FIG. 36. FIG. 26B illustrates the cross-sectional view obtained from the plane that contains line B-B in FIG. 36. The perspective view of this structure is shown in FIG. 9, except that gate contact plugs 66B are not illustrated in FIGS. 26A and 26B. Source/drain contact plugs 66A, as shown in FIG. 26B, are in contact with the source/drain silicide regions 69, which are formed on the surfaces of source/drain regions 42. In accordance with some embodiments of the present disclosure, contact plugs 66A and 66B include a metal nitride layer (such as TiN layer) and a metal region (formed of tungsten or cobalt) over the metal nitride layer.

FIGS. 27 through 34 illustrate the intermediate stages in the formation of air gaps 39 (FIG. 25) after the formation of both replacement gates and source/drain contact plugs in accordance with some embodiments. In accordance with these embodiments, the processes shown in FIGS. 1 through 9 are performed, and the steps shown in FIGS. 10 through 18 and the process steps in FIGS. 20 through 25 were skipped. Accordingly, in FIG. 9, air gaps 39 have not been formed yet, and the processes shown in FIGS. 27 through 34 are then performed to form air gaps 39.

Figure 27:
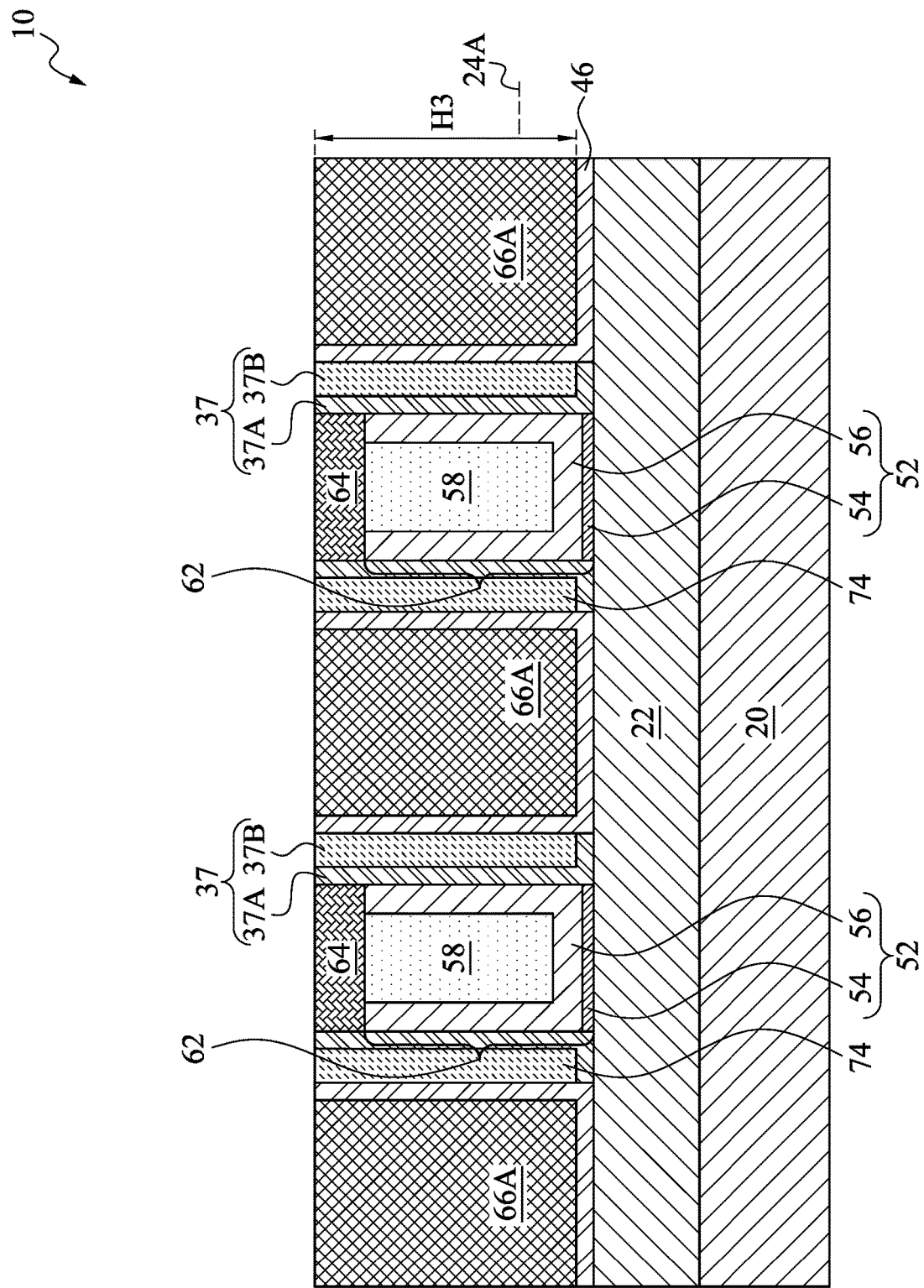
FIGS. 27 through 34, 35A, and 35B are cross-sectional views of intermediate stages in the formation of air gaps in gate spacers after the formation of source/drain contact plugs in accordance with some embodiments.

FIG. 27 illustrates a cross-sectional view of the structure shown in FIG. 9, in which replacement gates 62, hard masks 64, and source/drain contact plugs 66A are illustrated. Gate contact plugs have not been formed yet. In accordance with these embodiments, as shown in FIG. 27, source/drain contact plugs 66A are shown as extending laterally to contact opposite vertical portions of CESL 46. Accordingly, in the illustrated plane, the portions of ILD 48 between two neighboring replacement gates 62 are all replaced with source/drain contact plugs 66A. In accordance with other embodiments of the present disclosure, there may be remaining ILD 48 left on opposite sides of contact plug 66A, similar to what are shown in FIG. 26A. Hard masks 64 cover replacement gates 62. Hard masks 64 may be formed of $ZrO_2$, $Al_2O_3$, SiN, SiON, SiCN, $SiO_2$, or the like.

Figure 28:
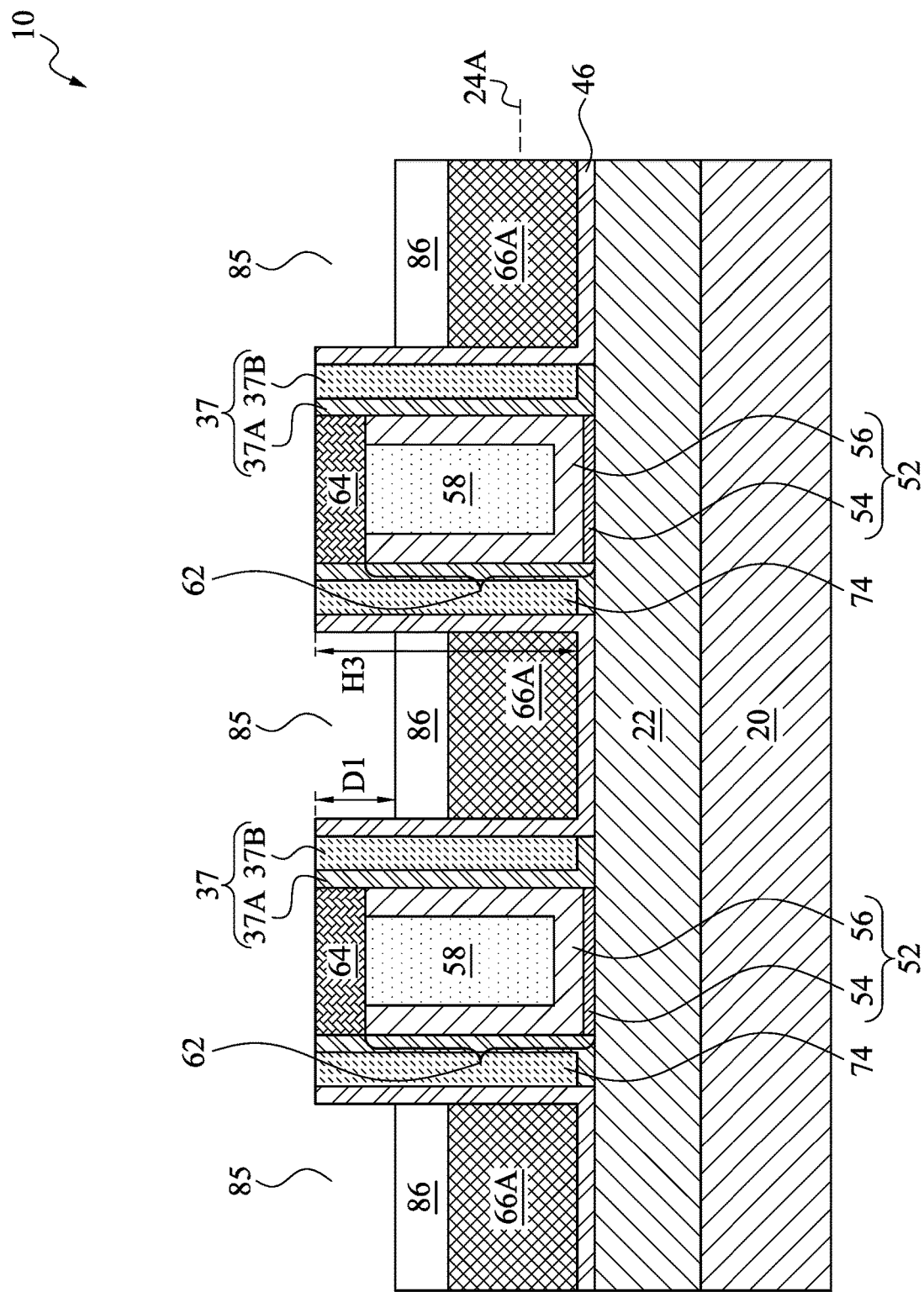

In accordance with some embodiments of the present disclosure, contact plugs 66A comprise cobalt. Protection layer 86 may be formed to protect the underlying cobalt-containing contact plugs 66A, as shown in FIG. 28. In accordance with some embodiments of the present disclosure, protection layer 86 is a conductive layer, which may further be a metal layer formed of a metal different from the metal in contact plugs 66A. For example, protection layer 86 may be a tungsten layer. Protection layer 86 may also be formed of a dielectric material such as SiN, $SiO_2$, SiCN, or the like. The formation of protection layer 86 may include recessing contact plugs 66A to form recess 85, as shown in FIG. 28, depositing protection layer 86 to a level higher than the top surfaces of hard masks 64, planarizing the top surface of protection layer 86, and performing an etching process to recess protection layer 86. The respective step is illustrated as step 214 in the process flow 200 as shown in FIG. 38. The level of the top surface of protection layer 86 partially determines the height of the subsequently formed air gaps. For example, the top surface of protection layer 86 may be level with or lower than the top surface of replacement gates 62. Recess 85 has depth D1, which may be in the range between about 5 nm and about 10 nm. Ratio D1/H3 may be in the range between about 0.08 and about 0.16, wherein H3 is the height (shown in FIG. 27) of contact plug 66A before the formation and the recessing of protection layer 86.

Figure 29:
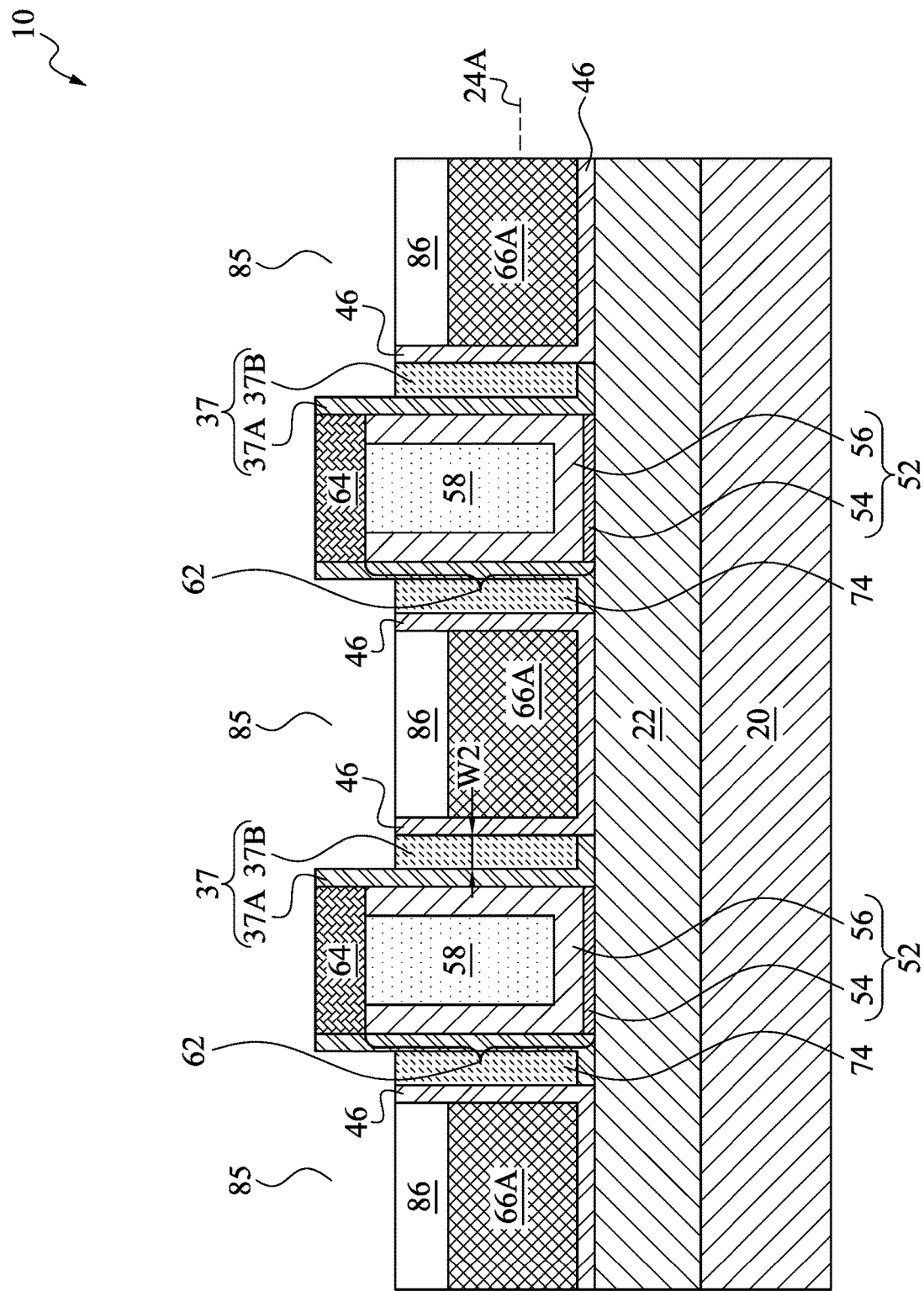
Figure 30:
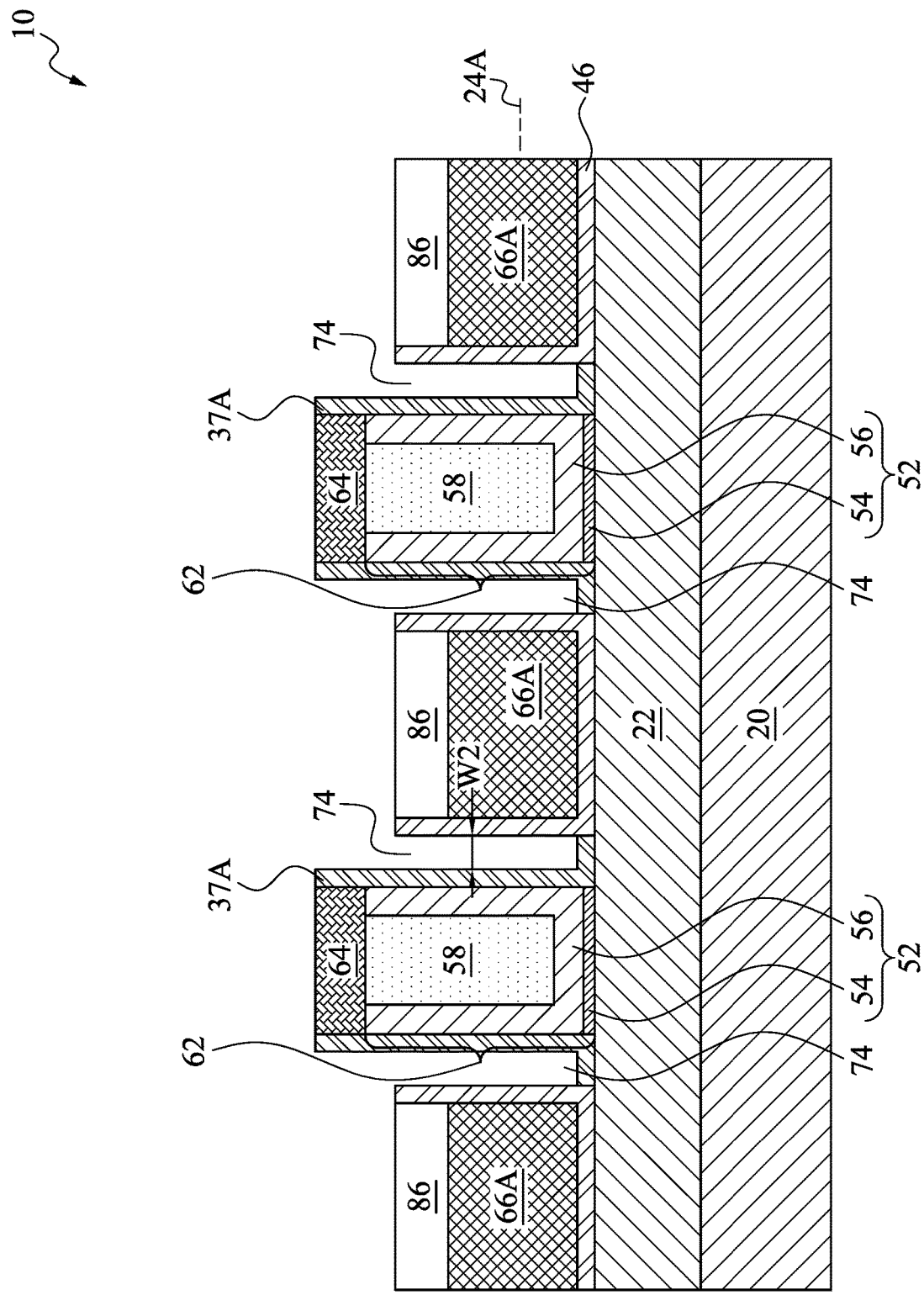

Next, as shown in FIG. 29, CESL 46 and dummy spacer portions 37B are etched, so that their top surfaces are lowered. The respective step is illustrated as step 216 in the process flow 200 as shown in FIG. 38. Hard masks 64 and protection layer 86 protect the underlying features from being etched. Dummy spacer portions 37B are then removed in an etching step, forming trenches 74, as shown in FIG. 30. The respective step is illustrated as step 218 in the process flow 200 as shown in FIG. 38. The etching process may be an isotropic etching process, which may be a dry etching process or a wet etching process.

Figure 23:
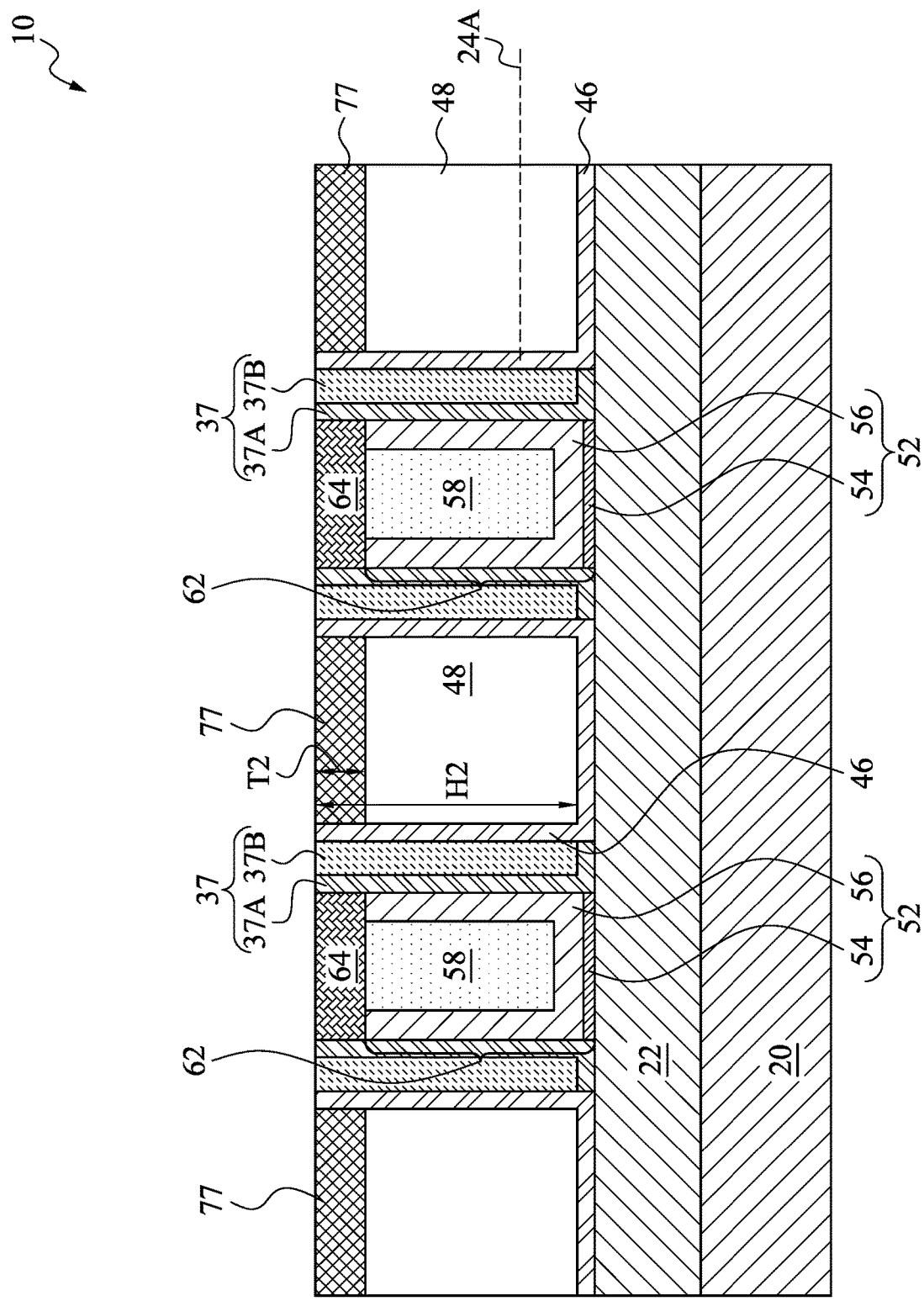

During the etching of CESL 46 and dummy spacer portions 37B, since some portions of ILD 48 (not shown in FIG. 30, refer to FIG. 9) may be exposed, an additional protection layer (not shown) may be formed before the etching of dummy spacer portions 37B to protect the exposed portion of ILD 48. The formation process and the material of the additional protection layer may be similar to that of protection layer 77 as shown in FIGS. 22 and 23. The additional protection layer protects ILD 48 from being etched when trenches 74 are formed.

Figure 31:
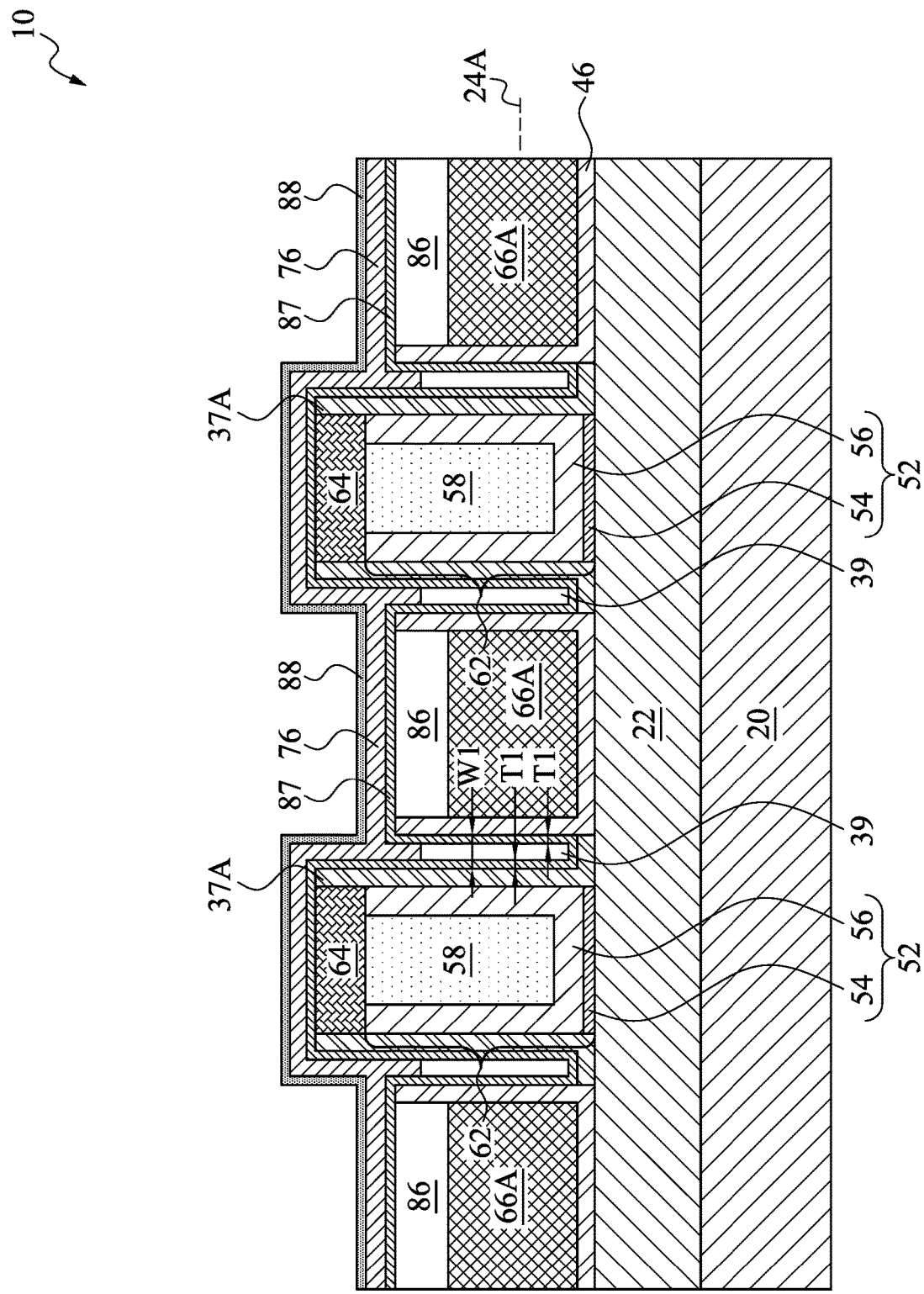

In a subsequent step, as shown in FIG. 31, dielectric layer(s) are formed to seal air gaps 39. The respective step is illustrated as step 220 in the process flow 200 as shown in FIG. 38. In accordance with some embodiments of the present disclosure, dielectric liner 87 is deposited as a conformal layer to extend into trenches 74 (FIG. 30). In accordance with some embodiments, the sidewall portion of dielectric liner 87 has thicknesses T1 and T1', which may be in the range between about 0.5 nm and about 2 nm. The ratios T1/W2 and T1'/W2 may be in the range between about 0.2 and about 0.4, wherein W2 is the width of trenches 74 (FIG. 30). In accordance with alternative embodiments, the formation of dielectric liner 87 is skipped. Dielectric sealing layer 76 is then formed to seal air gaps 39. It is appreciated that air gaps 39 may have different shapes than illustrated. For example, air gaps 39 may have the shapes shown in FIG. 37 or other shapes. Dielectric sealing layer 76 may be formed using a non-conformal deposition method such as PECVD, so that the height of Dielectric sealing layer 76 is as great as possible, for example, greater than about 2 nm, and may be in the range between about 1 nm and about 3 nm. Protection layer 88 may then be formed. In accordance with some embodiments of the present disclosure, protection layer 88 is formed using a material, with protection layer 88 and ILD 48 (FIG. 35B, not shown in FIG. 31) having a high etching selectivity. In accordance with alternative embodiments, depending on the materials in the wafer, protection layer 88 may not be formed.

Figure 32:
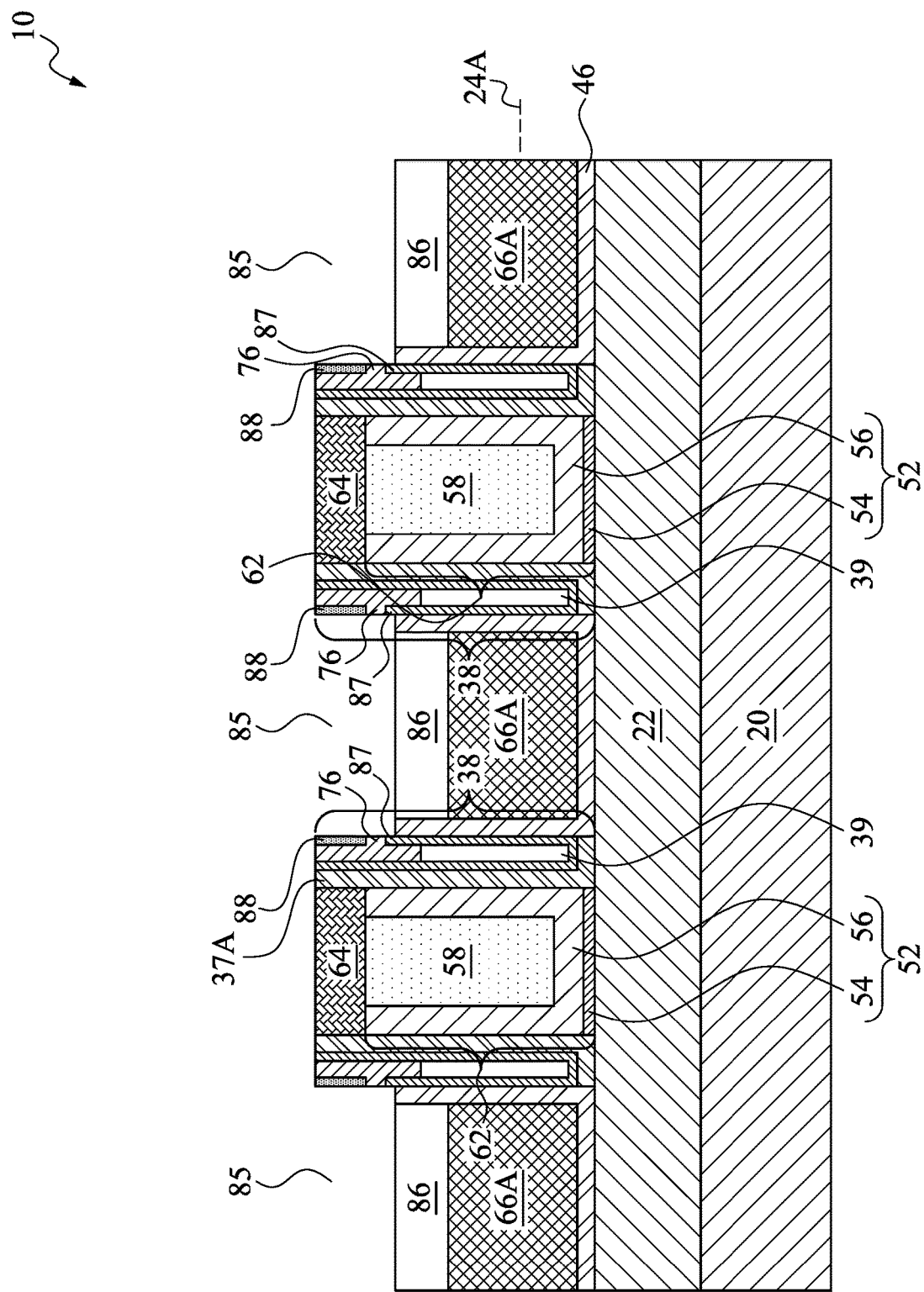

In a subsequent step, an anisotropic etching process (or a plurality of anisotropic etching processes) is performed, and the horizontal portions of layers 87, 76, and 88 are removed. The resulting structure is shown in FIG. 32. Protection layer 86 is thus revealed. The respective step is illustrated as step 222 in the process flow 200 as shown in FIG. 38. Throughout the description, the combined regions including layers 87, 76, 88, 37A, and air gap 39 are in combination referred to as gate spacers 38.

Figure 33:
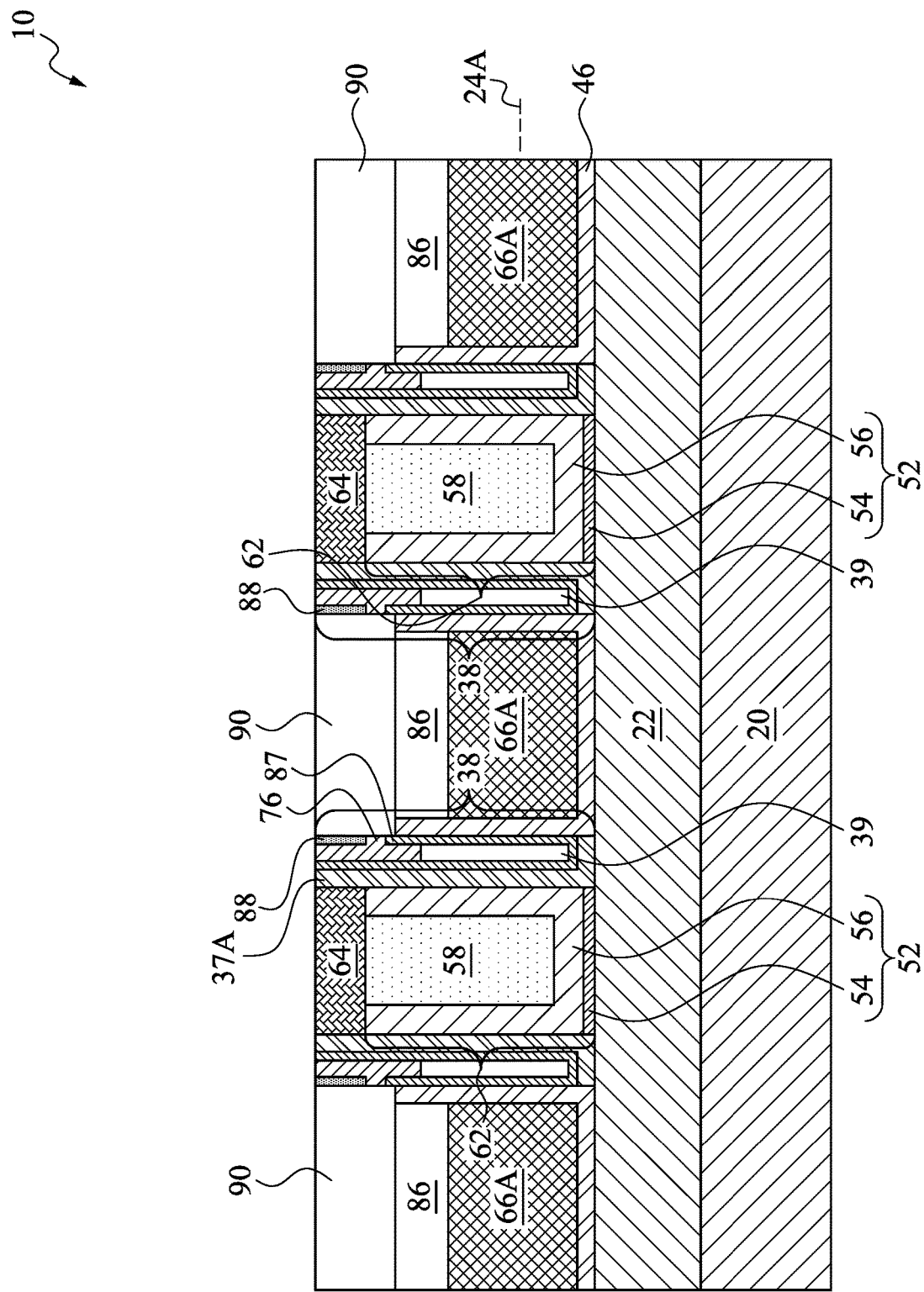

FIG. 33 illustrates the formation of self-aligned dielectric regions 90. The respective step is illustrated as step 224 in the process flow 200 as shown in FIG. 38. In accordance with some embodiments, the formation of dielectric regions 90 includes depositing a dielectric material, and performing a planarization to remove excess portions of the dielectric material over the top surfaces of hard masks 64.

Figure 34:
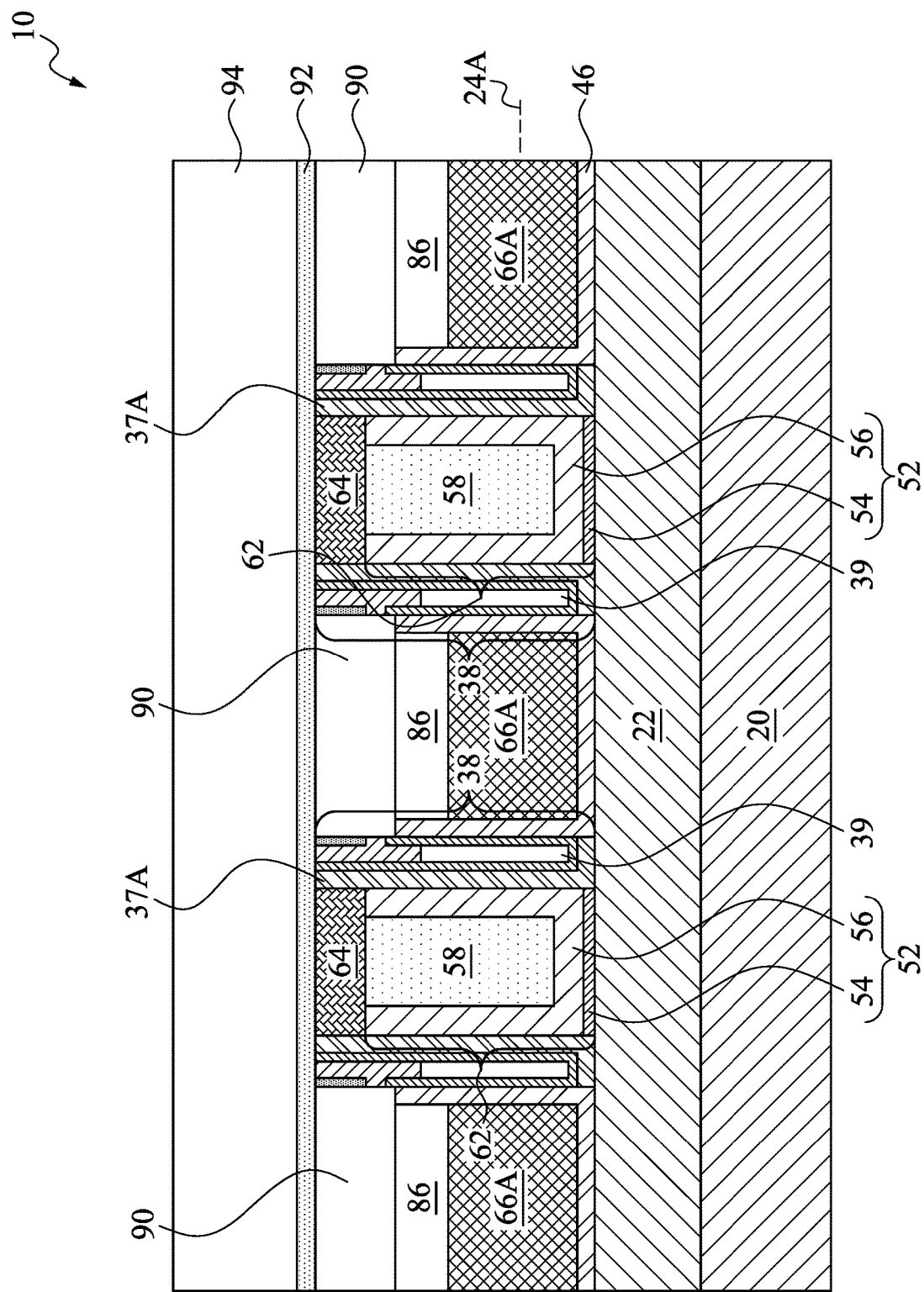
Figure 35A:
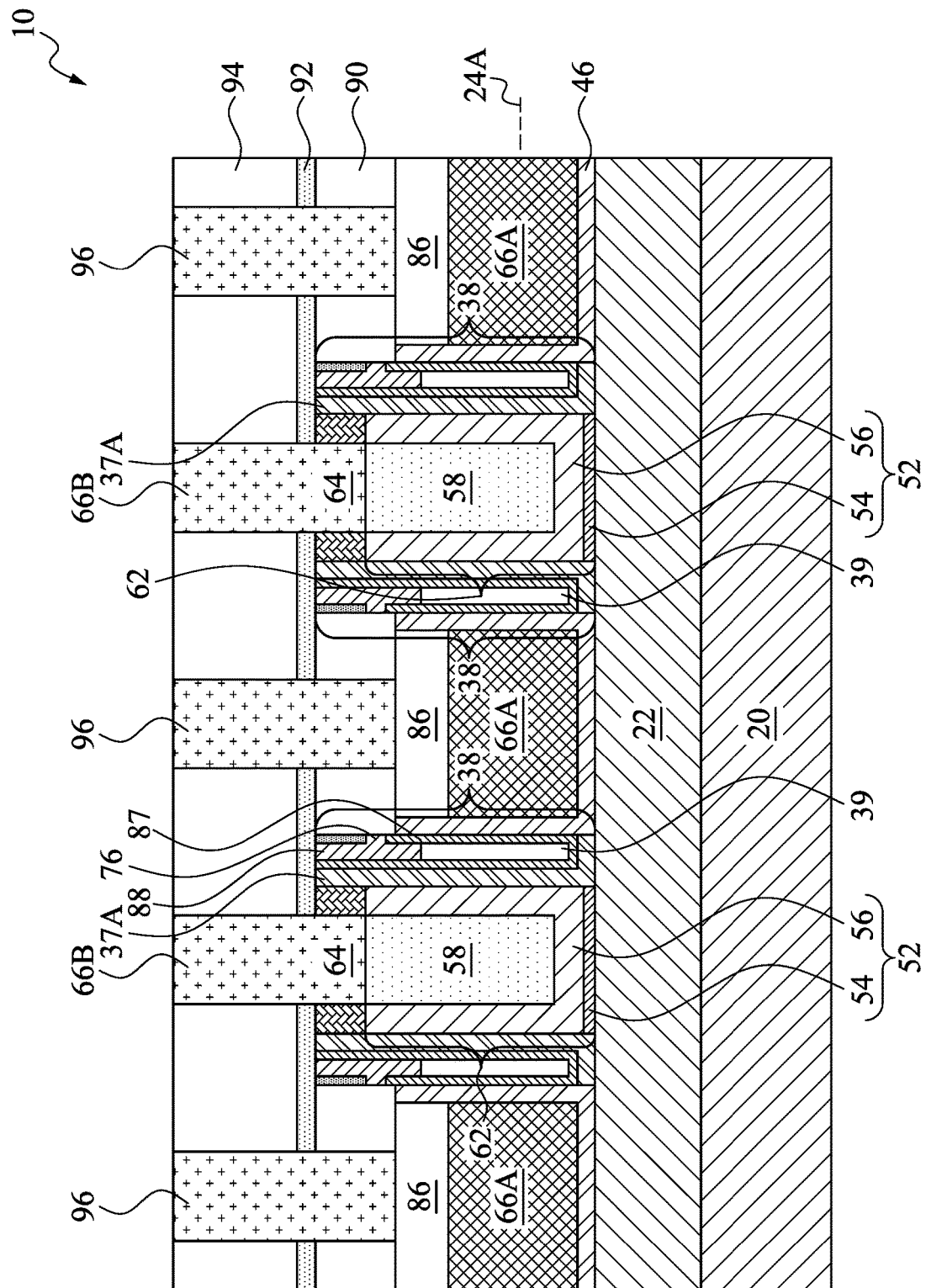
Figure 35B:
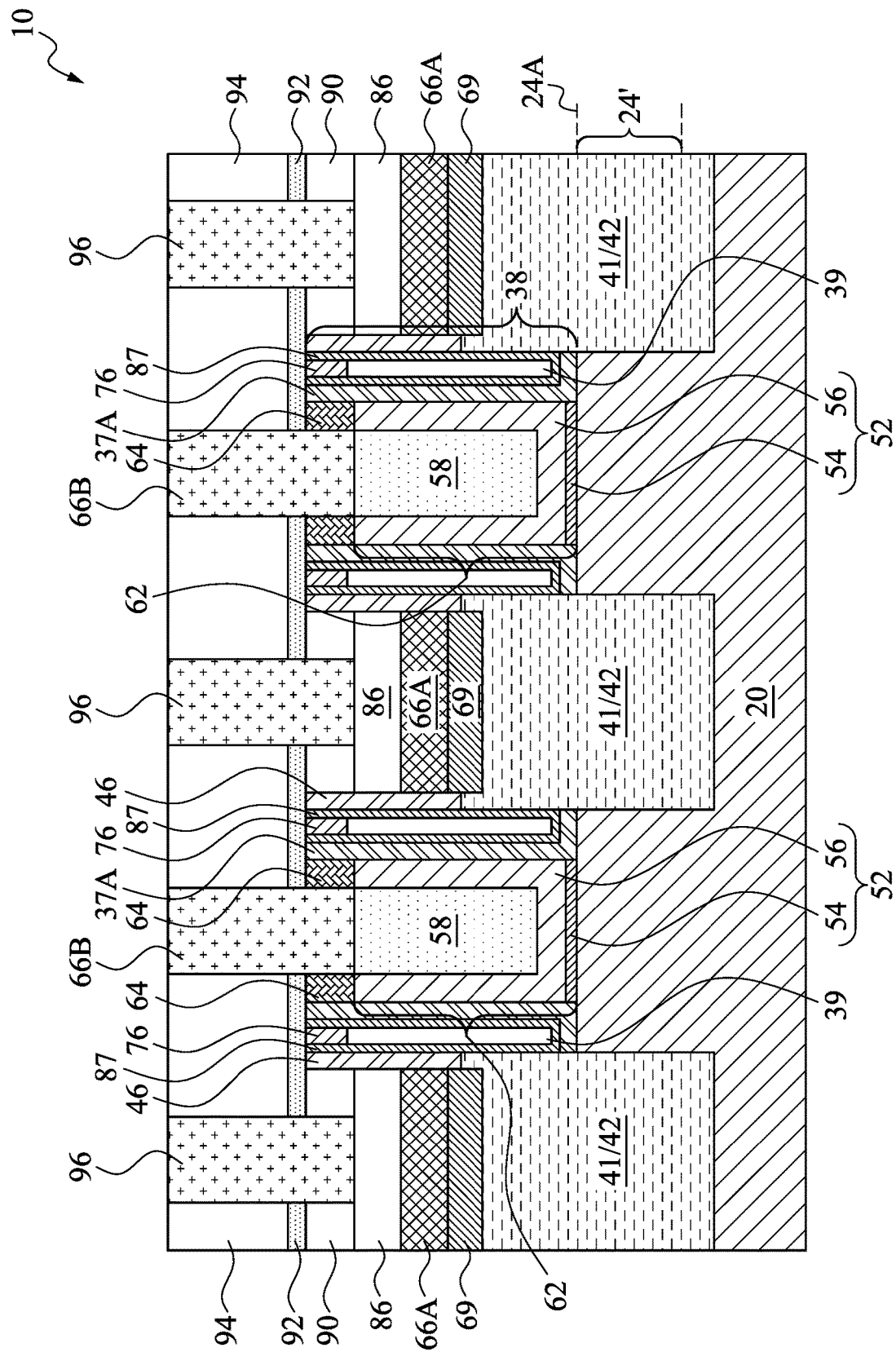

FIG. 34 illustrates the formation of etch stop layer 92 and ILD 94. FIGS. 35A and 35B illustrate different cross-sectional views in the formation of source/drain contact plugs 96 and gate contact plugs 66B, followed by a planarization process. FIG. 35A illustrates the cross-sectional view obtained from the plane that contains line A-A in FIG. 36. FIG. 35B illustrates the cross-sectional view obtained from the plane that contains line B-B in FIG. 36. Source/drain contact plugs 96, as shown in FIG. 35B, contact the underlying protection layer 86 when protection layer 86 is conductive, or penetrate through protection layer 86 to be in contact with contact plugs 66A when protection layer 86 is formed of a dielectric material.

The embodiments of the present disclosure have some advantageous features. Since air gaps have a k value equal to 1.0, which is lower than the k values of other dielectric materials, the k values of the gate spacers are reduced when air gaps are included. The reduction of the k value of the gate spacers result in the reduction of the parasitic capacitance between gate electrodes and nearby regions such as source/drain regions and source/drain contacts. Accordingly, the speed of the resulting FinFET is improved.

In accordance with some embodiments of the present disclosure, a method includes forming a gate stack over a semiconductor region, and forming a first gate spacer on a sidewall of the gate stack. The first gate spacer includes an inner sidewall spacer, and a dummy spacer portion on an outer side of the inner sidewall spacer. The method further includes removing the dummy spacer portion to form a trench, and forming a dielectric layer to seal a portion of the trench as an air gap. The air gap and the inner sidewall spacer in combination form a second gate spacer. A source/drain region is formed to have a portion on an outer side of the second gate spacer. In an embodiment, the method further includes forming a buffer dielectric layer contacting a sidewall of the first gate spacer; forming a sacrificial layer over a bottom portion of the buffer dielectric layer; recessing the buffer dielectric layer and the sacrificial layer to expose the dummy spacer portion, wherein the dummy spacer portion is removed after the buffer dielectric layer and the sacrificial layer are recessed; and removing the buffer dielectric layer and the sacrificial layer. In an embodiment, the method further includes forming a contact etch stop layer contacting a sidewall of the first gate spacer; and forming an inter-layer dielectric over a bottom portion of the contact etch stop layer, wherein the dummy spacer portion is removed after the inter-layer dielectric is formed, and the contact etch stop layer has a sidewall exposed to the air gap. In an embodiment, the method further includes forming a first source/drain contact plug over and electrically coupling to the source/drain region; recessing the first source/drain contact plug to form a recess; and forming a protection layer in the recess, wherein the dummy spacer portion is removed with the protection layer protecting the first source/drain contact plug. In an embodiment, the protection layer is formed of a conductive material, and the forming the protection layer comprises forming a second source/drain contact plug over and contacting the protection layer. In an embodiment, the method further includes forming a dielectric liner to fill a portion of the trench, wherein the air gap is spaced apart from the inner sidewall spacer by a part of the dielectric liner. In an embodiment, the air gap has a portion extending lower than a top surface of the source/drain region.

In accordance with some embodiments of the present disclosure, a method includes forming a dummy gate stack on a semiconductor fin; forming a dummy gate spacer on a sidewall of the dummy gate stack; forming a contact etch stop layer over a source/drain region, wherein the source/drain region is on a side of the dummy gate spacer; forming an inter-layer dielectric over a portion of the contact etch stop layer; replacing the dummy gate stack with a replacement gate stack; forming a first contact plug over and electrically coupling to the source/drain region, wherein the first contact plug penetrates through the contact etch stop layer; etching a portion of the dummy gate spacer to form a trench; and forming a sealing layer to fill a top portion of the trench, wherein a lower portion of the trench is sealed as an air gap. In an embodiment, the dummy gate spacer comprises: an inner sidewall portion; and a dummy spacer portion on an outside of the inner sidewall portion, wherein the dummy spacer portion is etched to form the trench, and the inner sidewall portion remains after the etching. In an embodiment, the inner sidewall portion comprises a vertical leg on the dummy gate stack; and a horizontal leg, wherein the dummy spacer portion overlaps and contacts the horizontal leg, and wherein the trench extends to a top surface of the horizontal leg. In an embodiment, the method further includes forming a dielectric liner to fill outer portions of the trench, with an inner portion of the trench left as the air gap. In an embodiment, the method further includes forming a second contact plug over and contacting the first contact plug, wherein after the second contact plug is formed, the air gap remains. In an embodiment, the method further includes before the portion of the dummy gate spacer is etched to form the trench, recessing the first contact plug to form a recess; and forming a protection layer in the recess, wherein when the portion of the dummy gate spacer is etched, the protection layer protects the first contact plug. In an embodiment, the first contact plug comprises cobalt, and the protection layer comprises tungsten.

In accordance with some embodiments of the present disclosure, a device includes a gate stack; a gate spacer on a sidewall of the gate stack, wherein the gate spacer comprises: an inner sidewall spacer having a vertical portion contacting the gate stack; and an air gap, wherein the gate stack and the air gap are on outer side of the vertical portion of the inner sidewall spacer; and a contact etch stop layer having a vertical portion, wherein the vertical portion of the contact etch stop layer and the vertical portion of the inner sidewall spacer are on opposite sides of the air gap. In an embodiment, the air gap forms a ring encircling the gate stack. In an embodiment, the device further includes a semiconductor fin, wherein the gate stack is on sidewalls and a top surface of the semiconductor fin, and the air gap extends lower than a top surface of the semiconductor fin. In an embodiment, the inner sidewall spacer further comprises a horizontal portion, and the air gap overlaps the horizontal portion. In an embodiment, the contact etch stop layer is exposed to the air gap. The device further includes a dielectric layer having a portion spacing the contact etch stop layer apart from the air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a gate stack;
a gate spacer on a sidewall of the gate stack, wherein the gate spacer comprises:
an inner sidewall spacer comprising a first vertical portion, wherein the first vertical portion contacts the gate stack; and
an air gap; and
a contact etch stop layer having a second vertical portion, wherein the second vertical portion of the contact etch stop layer and the first vertical portion of the inner sidewall spacer are on opposing sides of the air gap, and the air gap comprises a first portion higher than, and a second portion lower than, a bottom of the contact etch stop layer.

2. The device of claim 1 further comprising a source/drain region on a side of the gate stack, wherein an edge of the source/drain region is exposed to the air gap.

3. The device of claim 1, wherein an edge of the contact etch stop layer is exposed to the air gap.

4. The device of claim 1, wherein the inner sidewall spacer further comprises a horizontal portion joined to a bottom end of the first vertical portion, and wherein a top surface of the horizontal portion is exposed to the air gap.

5. The device of claim 1 further comprising a dielectric sealing layer, with at least a portion of the dielectric sealing layer being overlapping and exposed to the air gap.

6. The device of claim 5, wherein the dielectric sealing layer extends to a bottom end of the first vertical portion of the inner sidewall spacer.

7. The device of claim 5, wherein the dielectric sealing layer further comprises a portion overlapping the gate spacer.

8. The device of claim 5, wherein a first top end of the dielectric sealing layer is coplanar with a second top end of the gate spacer.

9. The device of claim 1, wherein the air gap forms a ring encircling the gate stack.

10. The device of claim 1 further comprising a semiconductor fin, wherein the gate stack is on sidewalls and a top surface of the semiconductor fin, and the air gap comprises a portion extending lower than the top surface of the semiconductor fin.

11. A device, comprising:
a gate stack;
an inner sidewall spacer comprising:
a vertical portion on a sidewall of the gate stack; and
a horizontal portion connected to a bottom end of the vertical portion;
a contact etch stop layer;
an air gap, wherein both of the inner sidewall spacer and the contact etch stop layer are exposed to the air gap; and
a source/drain region on an opposite side of the air gap than the inner sidewall spacer, wherein the source/drain region is exposed to the air gap.

12. The device of claim 11, wherein a first edge of the contact etch stop layer is vertically aligned to a second edge of the source/drain region, and wherein both of the first edge and the second edge are exposed to the air gap.

13. The device of claim 12, wherein:
the first edge of the contact etch stop layer comprises a first upper part higher than a top end of the air gap, and a first lower portion exposed to the air gap; and
the second edge of the source/drain region comprises a second upper portion exposed to the air gap, and a second lower portion lower than an bottom end of the air gap.

14. The device of claim 11 further comprising a semiconductor fin, with the gate stack being on a top surface and sidewalls of the semiconductor fin, wherein the air gap comprises a first portion higher than the top surface of the semiconductor fin, and a second portion lower than the top surface of the semiconductor fin.

15. A device, comprising:
a semiconductor region;
a gate stack over the semiconductor region;
a gate spacer comprising:
an inner sidewall spacer, wherein the inner sidewall spacer comprises a first top end and a horizontal leg, and the horizontal leg is over the semiconductor region; and
an air gap overlapping the horizontal leg of the inner sidewall spacer; and
a source/drain region, wherein a portion of the source/drain region is exposed to the air gap.

16. The device of claim 15 further comprising a shallow trench isolation region, wherein the horizontal leg of the inner sidewall spacer comprises a top surface and a bottom surface, and wherein the top surface is exposed to the air gap, and the bottom surface contacts the shallow trench isolation region.

17. The device of claim 16, wherein the gate stack comprises a portion overlapping the shallow trench isolation region.

18. The device of claim 15 further comprising:
a contact etch stop layer; and
a dielectric sealing layer comprising a portion between, and contacting sidewalls of, the inner sidewall spacer and the contact etch stop layer, wherein a lower portion of the contact etch stop layer is exposed to the air gap.

19. The device of claim 18, wherein the source/drain region is overlapped by the contact etch stop layer, with a first edge of the contact etch stop layer being aligned to a second edge of the source/drain region.

20. The device of claim 11 further comprising a dielectric layer, wherein a portion of the dielectric layer is between, and is in contact with sidewalls of, the contact etch stop layer and the vertical portion of the inner sidewall spacer.

* * * * *